United States Patent
Renna et al.

(10) Patent No.: US 9,018,730 B2
(45) Date of Patent: Apr. 28, 2015

(54) MICROSTRUCTURE DEVICE COMPRISING A FACE TO FACE ELECTROMAGNETIC NEAR FIELD COUPLING BETWEEN STACKED DEVICE PORTIONS AND METHOD OF FORMING THE DEVICE

(75) Inventors: Crocifisso Marco Antonio Renna, Gela (IT); Antonino Scuderi, Misterbianco (IT); Carlo Magro, San Giovanni la Punta (IT); Nunzio Spina, Catania (IT); Egidio Ragonese, Aci Catena (IT); Barbaro Marano, Acireale (IT); Giuseppe Palmisano, S. Giovanni la Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 217 days.

(21) Appl. No.: 13/438,684

(22) Filed: Apr. 3, 2012

(65) Prior Publication Data
US 2012/0256290 A1    Oct. 11, 2012

(51) Int. Cl.
  *H01L 27/08*    (2006.01)
  *H01L 25/065*   (2006.01)
  *H01L 23/48*    (2006.01)
  *H01L 21/768*   (2006.01)
  *H01L 23/00*    (2006.01)

(52) U.S. Cl.
  CPC ............ *H01L 25/0657* (2013.01); *H01L 23/48* (2013.01); *H01L 2224/48091* (2013.01); *H01L 2224/48137* (2013.01); *H01L 2224/49175* (2013.01); *H01L 2225/06513* (2013.01); *H01L 2225/06541* (2013.01); *H01L 24/48* (2013.01); *H01L 24/49* (2013.01); *H01L 2225/06531* (2013.01); *H01L 21/76898* (2013.01); *H01L 23/481* (2013.01); *H01L 2924/30107* (2013.01); *H01L 2924/1305* (2013.01)

(58) Field of Classification Search
  CPC ............................. H01L 23/48; H01L 25/0657
  See application file for complete search history.

(56) References Cited

U.S. PATENT DOCUMENTS

| | | |
|---|---|---|
| 6,274,920 B1 | 8/2001 | Park et al. |
| 2007/0273015 A1 | 11/2007 | Nakashiba |
| 2009/0021974 A1 | 1/2009 | Nonomura et al. |
| 2009/0153229 A1* | 6/2009 | Hanke et al. ................... 327/530 |
| 2009/0243035 A1 | 10/2009 | Mashino |
| 2009/0309232 A1* | 12/2009 | Roy ............................... 257/774 |
| 2010/0008058 A1 | 1/2010 | Saen et al. |
| 2011/0049693 A1 | 3/2011 | Nakashiba et al. |
| 2011/0176339 A1 | 7/2011 | Kerber et al. |

FOREIGN PATENT DOCUMENTS

WO    2010/137090 A1    12/2010

* cited by examiner

*Primary Examiner* — Fernando L Toledo
*Assistant Examiner* — Valerie N Newton
(74) *Attorney, Agent, or Firm* — Seed IP Law Group PLLC

(57) ABSTRACT

A galvanic-isolated coupling of circuit portions is accomplished on the basis of a stacked chip configuration. The semiconductor chips thus can be fabricated on the basis of any appropriate process technology, thereby incorporating one or more coupling elements, such as primary or secondary coils of a micro transformer, wherein the final characteristics of the micro transformer are adjusted during the wafer bond process.

17 Claims, 21 Drawing Sheets

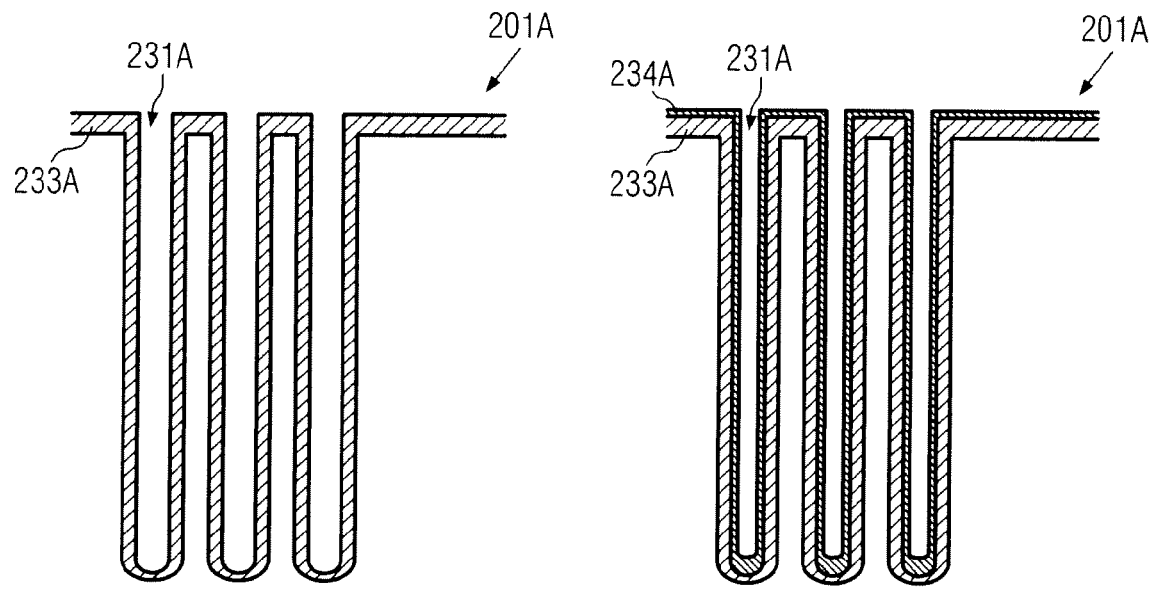
FIG. 2e
FIG. 2f
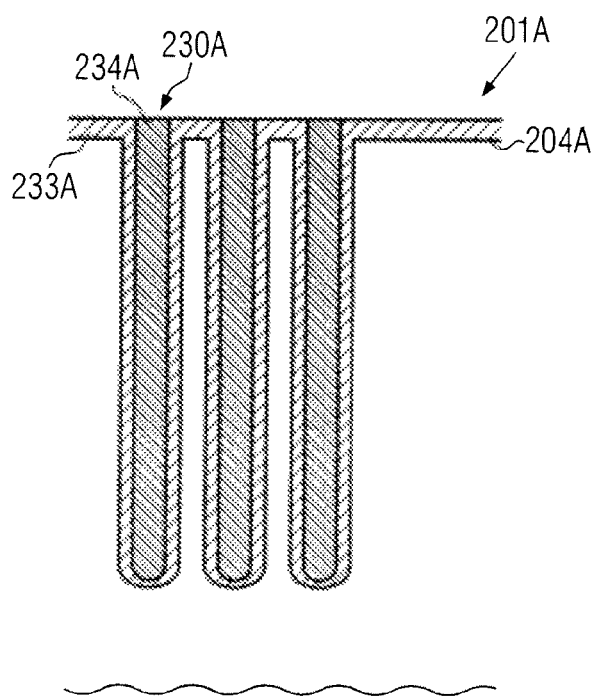
FIG. 2g

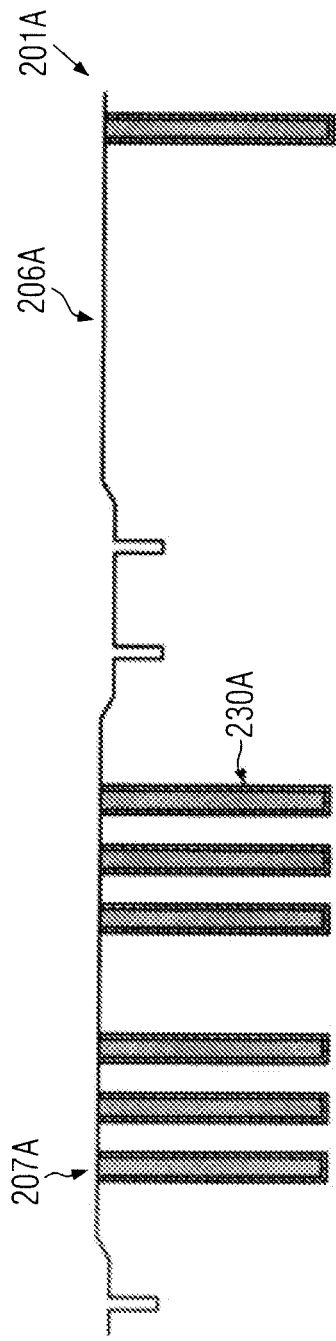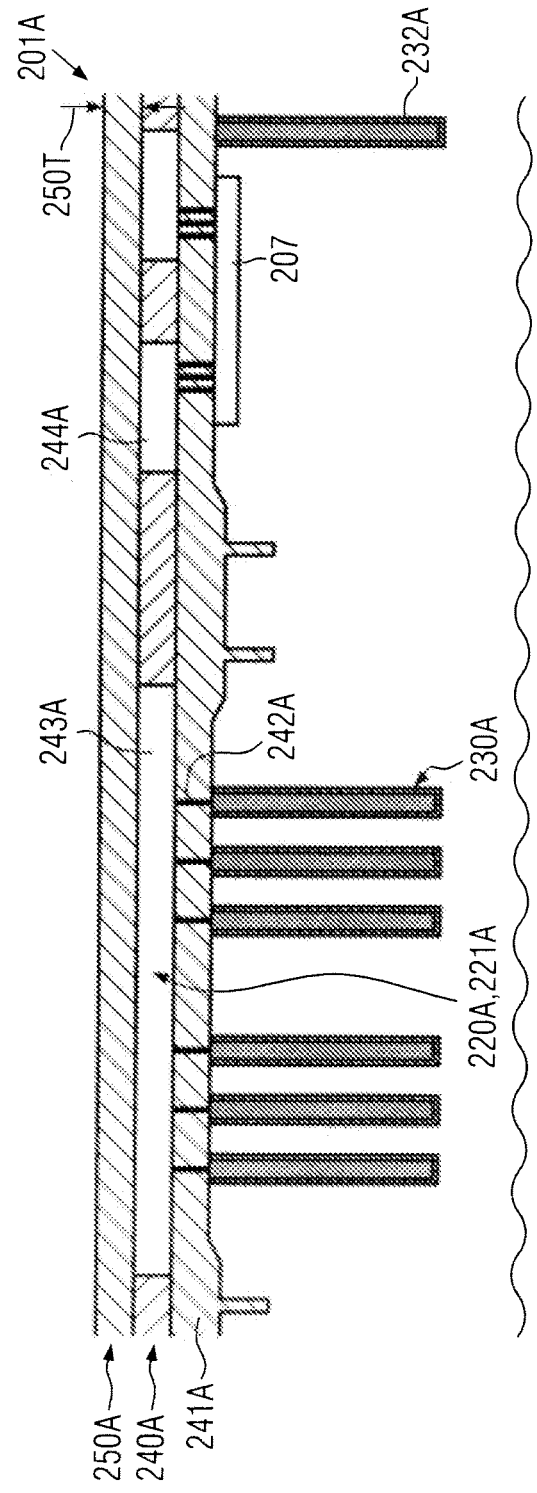

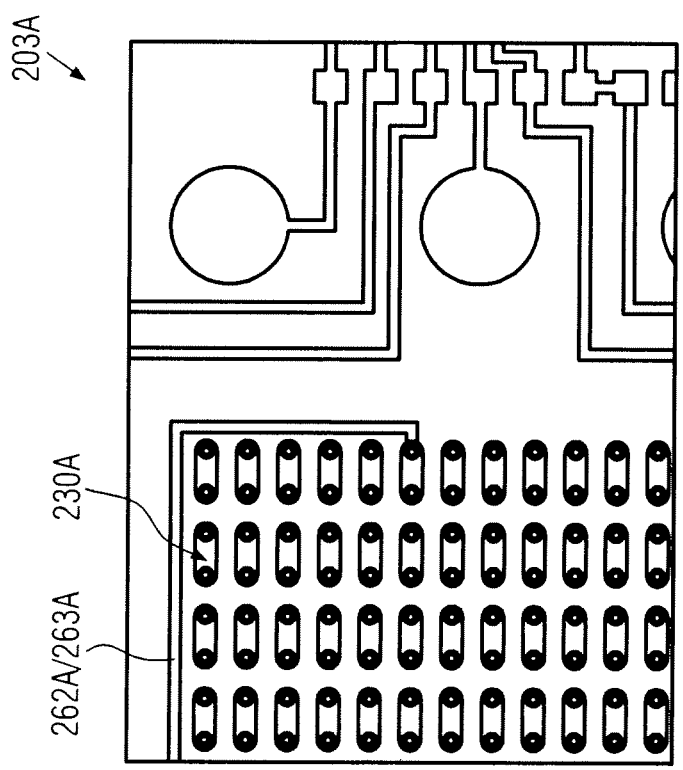

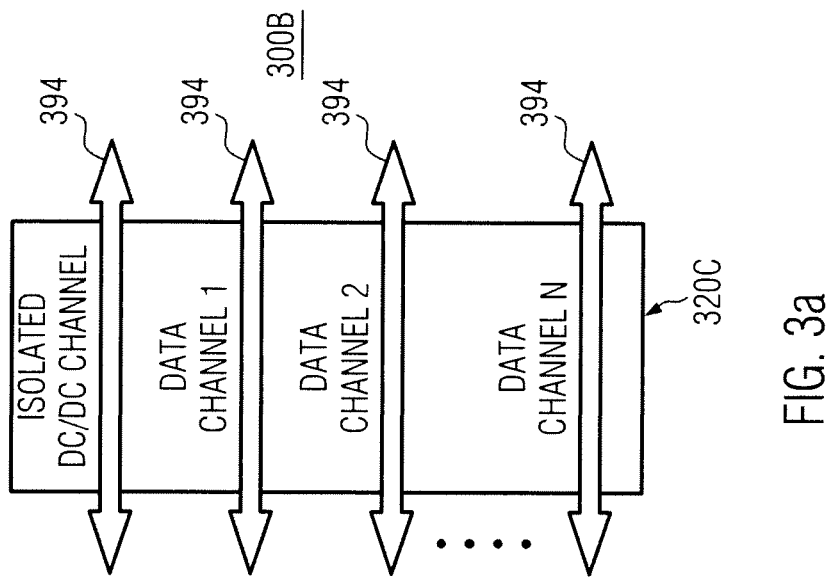
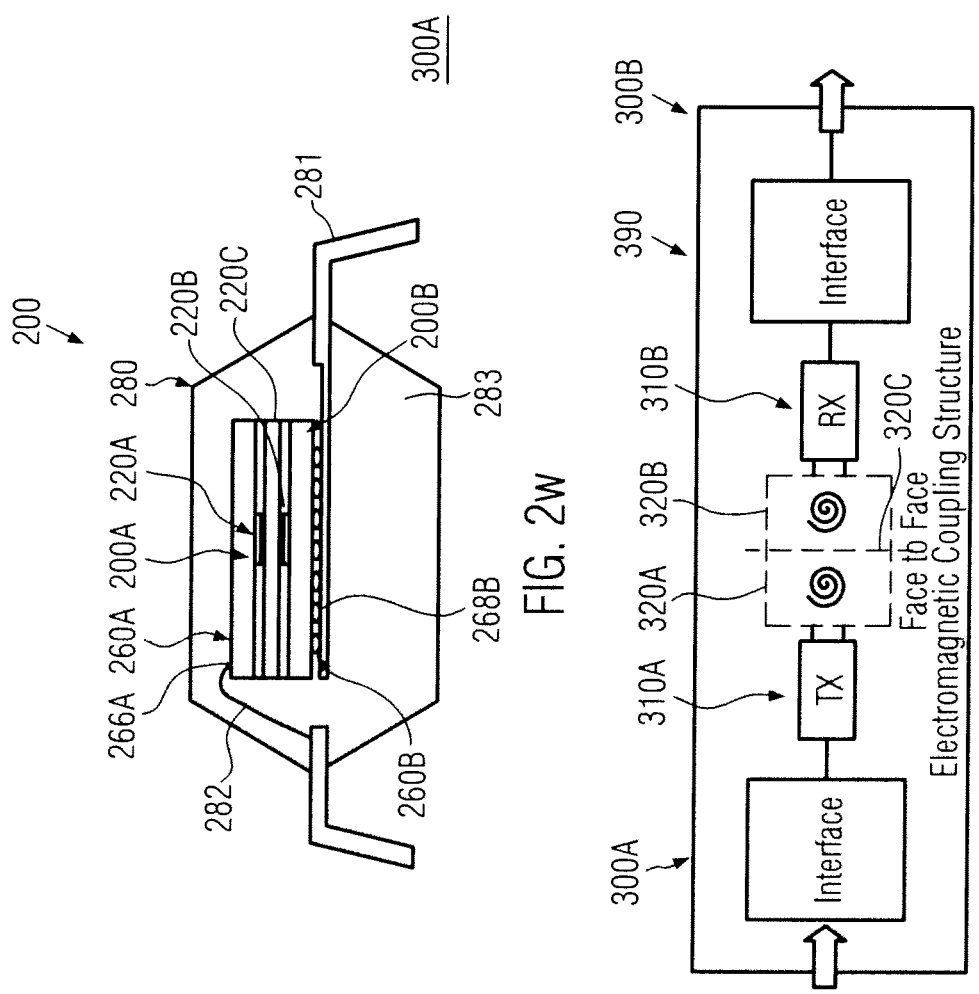

MICROSTRUCTURE DEVICE COMPRISING A FACE TO FACE ELECTROMAGNETIC NEAR FIELD COUPLING BETWEEN STACKED DEVICE PORTIONS AND METHOD OF FORMING THE DEVICE

BACKGROUND

1. Technical Field

Generally, the present disclosure relates to microstructure devices including at least some circuit elements that form an electric circuit portion, wherein a non-galvanic signal and/or energy transfer is implemented in the microstructure device by a wireless coupling mechanism formed on the basis of microelectronic components and manufacturing techniques.

2. Description of the Related Art

The significant progress in the field of semiconductor, micromechanical and microelectronic production techniques has resulted in the development and production of a wide variety of microstructure devices, which have incorporated therein more or less complex electronic circuit portions, possibly in combination with micromechanical and micro optical components in order to perform increasingly complex tasks without using complex peripheral components. Hence, there is an ongoing drive in many technical fields to integrate a variety of functions into a single microstructure device, which may thus significantly simplify the design of complex systems and reduce the production costs thereof. For example, integrated circuits are presently available, which may include thousands or millions of transistors, which in turn may be connected so as to form more complex circuit elements in order to implement any desired circuit configuration. Moreover, there is an increasing demand of combining very different types of circuit portions into a single semiconductor device in order to reduce the number and complexity of peripheral components. In many cases, complex control circuitry is combined with driver circuitry and power electronics which specific manufacturing techniques and circuit designs are devised in order to meet the very different specifications for small signal handling in combination with the processing of high currents and/or supply voltages. In this case, typically very different voltage domains may be provided in the same semiconductor device, wherein the transfer of signals and/or energy may be provided on the basis of a non-galvanic coupling of various circuit portions. Similarly, in many small signal applications data transfer between specific circuit portions has to be accomplished on the basis of a non-galvanic coupling in order to improve the immunity of the circuit portions with respect to any signal interferences and/or provide the possibility of coupling different circuit portions that are operated on the basis of different electrical potentials.

In order to implement a corresponding electromagnetic near field coupling mechanism on chip scale typically an appropriate micro transformer is conventionally provided in the semiconductor chip or within the same package, which also accommodates corresponding semiconductor chips that are to be coupled on the basis of the micro transformer.

FIG. 1a schematically illustrates a circuit diagram in which is depicted the basic concept of transferring energy and/or signals between galvanic-isolated circuit portions. The galvanic-isolated circuit portions may be used for data transfer in digital interfaces, utilizing a galvanic isolation, for instance with respect to different operating voltages, superior dielectric decoupling of the circuit portions and the like. In other cases, energy may be transferred in a wireless manner between the corresponding circuit portions in order to appropriately adapt the supply voltage of one of the circuit portions independently from the electric potential of the other circuit portion. For example, in many applications a supply voltage is used, which is at a significantly different electrical potential compared to the supply voltage level of a control circuit and the like. One important application in this respect is the provision of drive signals and drive energy for power transistors, for instance in motor control systems and the like, in which typically the power transistors are at different potentials from several tenths of Volts up to several hundred or even thousands of Volts, depending on the type of power system to be controlled. Similarly, sensing of voltage and/or current in power applications may typically call for a non-galvanic coupling between the sensing circuit portion and the complex control circuitry. Other applications of a wireless signal and/or energy transfer between circuit portions may include medical instrumentation, such as patient monitoring and the like.

In FIG. 1a, circuit portions 110a and 110b are implemented in a semiconductor device 100 on the basis of any appropriate manufacturing technology. The circuit portion 110a may generally represent any type of oscillator in order to provide input power to a micro transformer 120 implemented in the device 100, for instance in the form of one or more primary and secondary coils 120a, 120b, which are electrically isolated from each other depending on the overall device specifications. A corresponding isolation line 120c is schematically illustrated in FIG. 1a. Consequently, in the basic configuration of the device 100 in FIG. 1a, the primary coil 120a of the transformer 120 is connected to the circuit portion 110a and thus represents a part thereof, while the secondary coil 120b is connected to the circuit portion 110b and thus also represents a part thereof. In the example shown, the circuit portion 110b may represent a rectifier circuit in order to provide a substantially DC-based voltage and current for the circuit portion 110b for any further internal or peripheral circuit components (not shown). Typically, the micro transformer 120 has to be operated at moderately high frequencies in the range of several hundred kHz and significantly higher so that the overall size of the transformer 120 and also the number of windings in each of the primary and secondary coils 120a, 120b is compatible with the technology under consideration.

FIG. 1b schematically illustrates the microstructure device according to some conventional approaches in which the circuit portion 110a may represent any appropriate circuitry for receiving and/or conditioning an appropriate input power in order to appropriately operate the micro transformer 120. For example, as shown in FIG. 1b, the circuit portion 110a is configured to receive and provide power to the primary coil 120a in a range of approximately 50-500 mW, while in addition or alternatively the circuit portion 110a is configured to handle small signals, such as data signals, which are to be transferred wirelessly to the circuit portion 110b, which thus represents the output stage of a corresponding wireless data channel. In the example shown, the circuit portion or portions 110a are provided on a specific substrate or semiconductor chip and are connected to the transformer 120, i.e., the primary coil or coils 120a, on the basis of bond wires 111a. Similarly, the circuit portions 110b are provided on a dedicated semiconductor chip or substrate and are connected to the secondary coil 120b by means of bond wires 111b. Consequently, in an actual implementation the circuit portions 110a, 110b and the transformer 120, for instance provided in the form of corresponding metal windings or spirals, are arranged side by side on an appropriate carrier substrate and are connected by well-established wire bond techniques and the composite device may be processed on the basis of appropriate packaging techniques, for instance by providing a lid for the carrier substrate and the like. The individual components of the device 100, i.e., the circuit portions 110a, 110b and the micro transformer 120, are formed on the basis of any desired process technology, for instance on the basis of CMOS techniques wherein the circuit portions 110a, 110b are formed as individual devices in accordance with the corresponding circuit layout and the design rules of the technology node under consideration. Similarly, the power transformer is typically formed in the top metal layer of the corresponding process technique, such as CMOS technology, followed by a specific post processing sequence in which an additional passivation material, such as a polyimide material, may be provided in order to subsequently receive a metal layer that is appropriately patterned into one or more metal windings. Similarly, a plurality of transformers can be implemented, for instance for energy transfer and signal transfer, so that the circuit portions 110a, i.e., circuit portions for energy transfer and signal transfer, and a respective number of circuit portions 110b are provided on the corresponding substrate materials. Similarly, the several micro transformers 120 are provided on one or more dedicated substrates so as to be connected by wire bonding upon packaging the device 100.

FIG. 1c schematically illustrates the microstructure device 100 according to other conventional approaches in which the device 100 may represent a DC-DC converter. In this case, the circuit portion 110a comprises a plurality of switching devices, such as MOS transistors, bipolar transistors and the like, possibly in combination with appropriate control circuitry and drive circuitry in order to appropriately switch the primary coil of the transformer 120. The circuit portion 110b represents a rectifier portion in combination with a voltage regulator in order to provide a desired DC output voltage that is galvanically isolated from the input power supplied to the circuit portion 110a. An optional transformer 120 may be implemented in order to establish an isolated feedback loop for controlling the circuitry 110a on the basis of the output voltage delivered by the circuit portion 110b.

FIG. 1d schematically illustrates the device 100 in a packaged configuration wherein the circuit portions 110a and 110b are isolated by the transformer or transformers 120, while these components are accommodated by a common package. In this case, the isolation line 120c is also established within a single semiconductor chip, similarly to the situation as described in FIG. 1b in which the isolation line 120c is provided on the basis of the metallization system used to implement the primary and secondary coils 120a, 120b.

Consequently, in these conventional approaches, an efficient energy and/or data transfer may be accomplished between different circuit portions on the basis of a micro transformer that may be formed on the basis of micro electronic manufacturing techniques. Due to economical demands an increased number of circuit functions is typically to be implemented into a given package size, thereby also triggering a significant reduction of the lateral size of the individual circuit portions which, however, may not be compatible with the conventional configurations of the microstructure device 100, as described with reference to FIGS. 1a-1d. That is, the circuit portions 110a, 110b are appropriately positioned laterally adjacent to the power transformer in order to obtain an appropriate electric connection, for instance by bond wires or by the device internal metallization system.

BRIEF SUMMARY

Some embodiments of the present disclosure are semiconductor devices and manufacturing techniques in which galvanically-isolated circuit portions are provided in a very space-efficient manner while at the same time providing for superior flexibility in adjusting electrical characteristics of the non-galvanic coupling, for instance in terms of isolation rating and power transfer efficiency.

One embodiment relates to a semiconductor device comprising a first chip that comprises a first substrate and a first semiconductor layer. The semiconductor device further comprises a first circuit portion that is formed in and above the first semiconductor layer. Additionally, the semiconductor device comprises at least one first through hole via extending through the first substrate and connecting a rear side of the substrate with the first circuit portion. Furthermore, the semiconductor device comprises a second chip attached to the first chip and comprising a second substrate and a second semiconductor layer. A second circuit portion is formed in and above the second semiconductor layer and at least one second through hole via extends through the second substrate and connects a rear side of the second substrate with the second substrate portion. Furthermore, the first and second circuit portions are electromagnetically coupled to each other by near field effect.

The stacked chip configuration of the semiconductor device thus enables a very space-efficient device configuration since the lateral area consumption is reduced compared to conventional device architectures. That is to say, the foot print of the device is significantly reduced compared to conventional arrangement, as for instance described above. Furthermore, the first and second circuit portions may be fabricated on the basis of the corresponding dedicated semiconductor chips on wafer basis by using any appropriate manufacturing technology, which may be the same or which may be different for the first and second circuit portions, thereby obtaining a high degree of flexibility in combining different types of circuits, process technologies and the like. On the other hand, the galvanically-isolated coupling, i.e., the electromagnetic near field coupling mechanism, implemented between the first and second circuit portions may be established by the stacked configuration in which an appropriately designed coupling element, such as one or more metal regions in the form of metal windings or spirals, capacitive structures and the like are appropriately provided within the first and second circuit portions at locations that provide for a desired coupling efficiency, while at the same time a desired degree of dielectric isolation may be achieved. For example, different isolation ratings may be adjusted by controlling the distance and/or the type of material used when attaching the first and second semiconductor chips on wafer level. Similarly, the degree of electromagnetic coupling may efficiently be adjusted, for instance by incorporating specific material compositions, such as dielectrics with high dielectric constant, if a capacitive coupling is desired, while in other cases superior magnetic coupling may be achieved by incorporating appropriate substances into the dielectric material that separates the windings or spirals in the first and second circuit portions. Furthermore, the through hole vias, which may also be referred to herein as "through silicon vias" (TSV) when the substrate material is substantially comprised of silicon, enable to appropriately connect the first and second circuit portions to any peripheral components, such as a package, for instance by bond wires, solder bumps or any other contact elements, without requiring any additional contact components at the substrate side in and above which the first and second circuit portions are fabricated, which at least comprise the corresponding coupling elements.

In one illustrative embodiment the semiconductor device further comprises a first coupling element formed in or above the first substrate and a second coupling element formed in or above the second substrate, wherein the first and second coupling elements are magnetically coupled to each other. In this configuration the first and second circuit portions may be coupled by means of an electromagnetic near field coupling structure, which may also be referred to herein as a "transformer" provided in the form of the first and second coupling elements. For example, appropriate conductive regions may be provided with a specific layout so as to act as a primary coil and a secondary coil which, contrary to conventional strategies, may be formed on separate substrates and may thus provide for superior flexibility in adjusting the overall magnetic and electrical performance of the resulting micro transformer. Furthermore, the final characteristics of the transformer may be adjusted or readjusted in some illustrative embodiments without actually modifying the corresponding manufacturing processes for forming the first and second circuit portions, since for instance the isolation rating and/or the degree of coupling may be adjusted upon bonding the first and second semiconductor chips, for instance by selecting an appropriate isolation distance, a dielectric material, possibly including substances with superior magnetic characteristics and the like.

In one illustrative embodiment, at least one of the first and second coupling elements is provided as a metal element formed in a metallization system of the first and/or the second chip. In this case, the coupling elements may be implemented on the basis of a given desired technology standard without any process modifications in view of forming the metal regions of the coupling elements. For example, appropriate metal windings or spirals may be formed in one or more metallization layers of the metallization system under consideration together with any other metal lines and vias without any additional process steps. Consequently, any number of coupling elements may efficiently be provided, for instance for forming a plurality of independent transformers, for instance for transferring energy and/or data signals, wherein these coupling elements can be provided within the context of a given desired process technique to be applied for forming the metallization system for other circuit elements of the first and/or second circuit portions. Moreover, depending on the complexity of the metallization system, a plurality of stacked metal windings may be provided so as to implement a primary or secondary coil with a desired number of windings. In this manner, the transformation ratio may readily be adapted in accordance with the device specifications.

In other illustrative embodiments, the coupling elements may be provided in the form of metal regions having an appropriate configuration so as to enable an efficient capacitive coupling, which may be advantageous for transferring signals between the first and second circuit portions. To this end, appropriate dielectric materials may be incorporated between the first and second semiconductor chips in order to adjust the degree of capacitive coupling and also obtain a desired dielectric breakdown voltage. In this manner, an efficient DC-decoupling may be accomplished while at the same time enabling the transfer of any AC signals.

In one illustrative embodiment, the first and second chips are attached such that the first and second semiconductor layers face each other. In this configuration, the basic configuration of the coupling elements may be established in each of the chips by using well-established manufacturing techniques, for instance by using well-established metallization regimes in combination with passivation layer stacks, while the electrical connections to the periphery may be obtained on the basis of a back side metallization connected to the first and second circuit portions by means of the through hole vias.

In a further illustrative embodiment, the semiconductor device further comprises a package that accommodates the first and second chips. As discussed above, due to the stacked configuration the lateral size of the semiconductor device and thus of the package may be reduced compared to conventional approaches, while at the same time the through hole vias provide for the connectivity with respect to the package. That is, in some illustrative embodiments as discussed above, the circuit portions and the coupling elements are formed in and above the "front side" of the substrates together with any other circuit elements, such as transistors, resistors and the like, using any desired process technology. By connecting the semiconductor chip face to face, hence well-defined electric and magnetic characteristics may be adjusted, thereby obtaining the desired coupling efficiency and the target isolation rating, while on the other hand the through-hole vias in combination with an appropriate contact regime enable electrical connection to the package, for instance by wire bonding and/or direct solder contact regimes. In this manner, increased functionality can be implemented into the same package size with desired characteristics of the non-galvanic coupling wherein, at least to a certain degree, the coupling characteristics can be adjusted during the packaging process without significant modifications during the manufacturing process for providing the first and second circuit portions.

In one illustrative embodiment, the first and/or the second through-hole vias comprise a high temperature resisting conductive fill material. In this case, the through-hole vias may be formed at an early manufacturing stage of the overall production process, for instance prior to any high temperature processes which are typically applied when forming transistors and activating dopant species and/or recrystallizing damaged semiconductor regions. Consequently, when forming the through-hole vias in an early manufacturing stage, the corresponding processes, such as the etch process including the provision of any hard mask materials and the like, may be accomplished without significantly affecting any other circuit elements or device areas. The high temperature resisting materials may be provided in the form of, for instance, highly doped polysilicon material, which represents a well-established base material in semiconductor production, which may efficiently be deposited by using CVD (chemical vapor deposition) techniques in high aspect ratio openings. In other illustrative embodiments, the high temperature resisting fill material is provided in the form of a carbon material which may have per se a moderately high conductivity, for instance compared to polysilicon material, while also exhibiting excellent high temperature behavior. The carbon material can be deposited on the basis of well-established CVD techniques wherein additional doping materials may be incorporated in order to even further enhance the overall conductivity. In this case, the lateral size of the through-hole vias may be reduced, thereby allowing to provide an increased density of through-hole vias within any specific device areas without compromising signal propagation delay and the like.

In still other illustrative embodiments, the first and/or the second through-hole vias comprise as a conductive fill material a metal and/or a polymer and/or a substance that comprises functional molecules. In this case, the conductive fill material is provided at any appropriate manufacturing stage, for instance after any high temperature treatments, in order to obtain the through-hole vias with desired characteristics in terms of conductivity, stress behavior and the like. For example, a plurality of efficient fill metals may be used, for instance in the form of tungsten, aluminum, copper and the like, as are typically used in the semiconductor production process when forming complex metallization systems. In other cases, appropriate polymer materials may be applied as long as the desired conductivity is obtained. To this end, a plurality of polymer materials is available, wherein the electrical characteristics may specifically be adjusted to the device specifications, for instance by incorporating conductive species and the like. In still other illustrative embodiments, functional molecules may be used, which are to be understood as corresponding polymer chains including functional groups so as to impart a desired characteristic to the functional molecule. For example, metal species may typically be incorporated into the functional groups, thereby imparting generally conductivity to the functional molecule, which may have an appropriate size so as to extend through the high ratio vias so as to connect with corresponding end portions to respective contact areas provided in and above the front side and the rear side of the substrate under consideration. Frequently, one or more characteristics of the functional molecules may be modified on the basis of electric fields, temperature and the like, thereby providing the possibility of implementing a "switchable" conductive connection by means of one or more of the through-hole vias.

In further illustrative embodiments, the first and second circuit portions are configured to enable wireless signal transfer between the first and second circuit portions. In this case, efficient data transfer, monitoring information and the like may be transferred between the first and second circuit portions, irrespective of the electrical potential of these circuit portions wherein, in some illustrative embodiments, a plurality of independent signal transfer channels may be provided. To this end, the electromagnetic near field coupling may be implemented in the form of a plurality of transformers in combination with appropriate circuitry in the corresponding first and second semiconductor chips. For example, a basic signal transfer channel may comprise an interface for receiving any input data and transmitter circuitry connected to the primary coil of the micro transformer, while on the other hand, a receiver circuit may be connected to the secondary coil so as to appropriately process the incoming signals from the transformer and an appropriate interface may be used to provide the output data. In other cases, the signal transfer may be accomplished on the basis of a capacitive coupling element if considered appropriate. In still other illustrative embodiments, at least one of the signal transfer channels implemented may be configured for a full duplex data transfer in order to provide for bi-directional data exchange. In this case, an appropriate transceiver circuit may be provided at each side of the micro transformer. In other illustrative embodiments, the bi-directional data exchange may be accomplished by combining two single channels of inverse data transfer direction.

In other illustrative embodiments, the electromagnetic near field coupling may provide for efficient energy transfer between the first and second circuit portions, wherein a power of approximately 50 mW-500 mW or even higher may be accomplished on the basis of a single energy transfer channel. In other illustrative embodiments, a plurality of parallel energy transfer channels may be provided so as to increase the overall power, allowing superior power density for a given package size due to the stacked configuration of corresponding drive and rectifier circuitry connected to the primary and secondary coils of the transformers in each of the energy transfer channels.

In some advantageous embodiments, one or both of the substrate materials of the first and second circuit portions include isolation regions that are arranged so as to reduce eddy currents induced by the one or both of the coupling elements during operation of the device. In this manner, a high transfer efficiency can be achieved without dedicated high-resistance substrate materials. Moreover, the quality of the coupling elements when provided as inductive structures, may be increased.

One embodiment is a method of forming a semiconductor device. The method comprises forming a first coupling element in each of a plurality of first chips that are provided as a first wafer and forming a second coupling element in each of a plurality of second chips provided as a second wafer, wherein the first and second coupling elements represent complementary coupling elements. The method further comprises bonding the first and second wafers so as to position the complementary first and second coupling elements to form an electromagnetically coupled near field structure.

As discussed above, the stacked configuration of the first and second chips enables the implementation of signal transfer channels and/or power transfer channels at reduced lateral size, while nevertheless providing for superior flexibility in adjusting the finally achieved electrical performance without modifying the first and second chips. Hence, the entire fabrication process for each of the first and the second circuit portions, except for dicing and packaging, may be accomplished on wafer level.

In one embodiment the bonding of the wafers comprises applying an adhesion material and adjusting the degree of coupling of the first and second coupling elements by selecting a material composition and/or a layer thickness of the adhesion material. In this case, the final performance may be adjusted on the basis of the adhesion material. It should be appreciated that a basic behavior of the coupling elements may be adjusted on the basis of the design of the coupling elements for a given technology standard used. That is, for a given technology, for instance in terms of type of dielectric materials used in a metallization system, type of metal material used in metal lines and the like, basic characteristics such as lateral size, the number of windings of a coil and the like can be defined during the manufacturing process for the first and second chips on wafer level, wherein different process technologies may be applied for the first and second wafers, depending on other device characteristics such as the type of circuit elements, such as transistors, to be used in the first and second chips in combination with the first and second coupling elements. In this manner, also a certain adjustment of the finally obtained characteristics of the electromagnetic near field coupling may be adjusted. However, according to the one embodiment, the independent preparation of the coupling elements of the electromagnetic structure coupled by near field effect, for instance based on the same or different technologies, may offer additional flexibility since during the bonding process important characteristics, such as dielectric strength and the like, may efficiently be adjusted in order to adapt the semiconductor device to different applications, even if the basic configuration of the corresponding semiconductor chips is substantially the same.

In a further illustrative embodiment, the method further comprises forming one or more through-hole vias in a substrate of the first and/or the second chip so as to connect the corresponding coupling element with a contact structure provided at an opposite side of the substrate. In this manner, the coupling elements, possibly in combination with other circuit elements such as transistors and the like, may efficiently be formed in and above the "front side" of the substrate in accordance with well-established process techniques, and subsequently the first and second chips may be bonded on wafer level, for instance face to face, while the through-hole vias may nevertheless provide for connectivity to any peripheral components, such as a package and the like. For example, a back side metallization may be provided so as to connect to the through-hole vias and provide contact capabilities for connecting to a substrate, for instance by bond wires or solder bumps and the like, thereby providing for full connectivity to the periphery, such as the package, while nevertheless ensuring an efficient manufacturing process for the coupling elements, which may thus be formed in combination with regular circuit elements.

BRIEF DESCRIPTION OF THE SEVERAL VIEWS OF THE DRAWINGS

Further illustrative embodiments are defined in the appended claims and are also described in the following detailed description, which is to be referred to in combination with the accompanying drawings, in which:

FIGS. 2b-2g schematically illustrate cross-sectional views and top views, respectively, of the semiconductor device during various manufacturing stages when forming through-hole vias in an early manufacturing stage according to one embodiment;

FIGS. 2h-2k schematically illustrate cross-sectional views of the semiconductor device in advanced manufacturing stages in which a composite semiconductor device including galvanically coupled circuit portions may be formed on the basis of wire bond techniques according to one embodiment;

FIGS. 2l-2u schematically illustrate cross-sectional views or top views, respectively, during further advanced manufacturing stages in which appropriate "back side" metallization systems may be established for the composite semiconductor device according to one embodiment;

FIG. 2w schematically illustrates the semiconductor device in a packaged state according to one embodiment;

FIG. 3a schematically illustrates the data and/or energy transfer capabilities of the stacked semiconductor device in which a full duplex energy and/or signal exchange may be accomplished on the basis of one or more non-galvanically coupled channels according to one embodiment; and FIG. 3b schematically illustrates a basic configuration of a signal and/or power transfer channel according to one embodiment.

With reference to the accompanying drawings further illustrative embodiments will now be described in more detail.

DETAILED DESCRIPTION

Figure 1A:
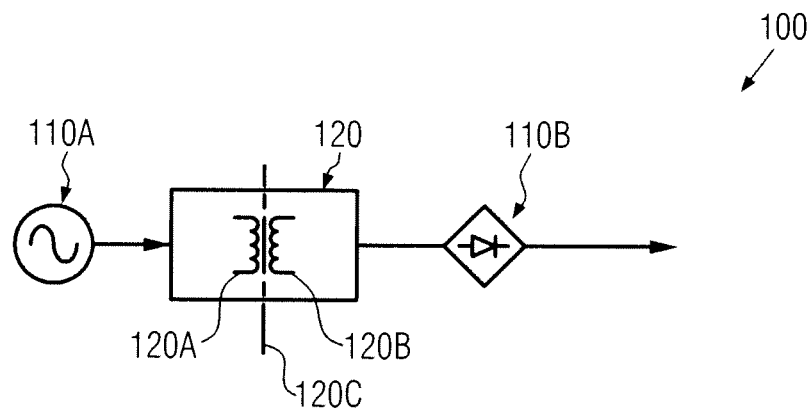
FIG. 1a schematically illustrates a conventional semiconductor device comprising a micro transformer and associated galvanically-isolated circuit portions.
Figure 1B:
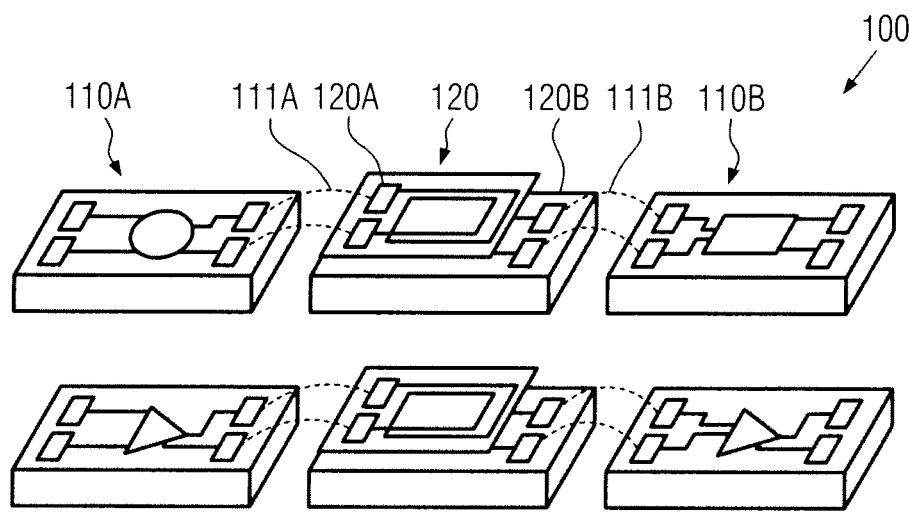
FIG. 1b schematically illustrates a side by side configuration of galvanically-isolated circuit portions and an intermediate micro transformer formed on the basis of dedicated substrates or chips according to conventional approaches.
Figure 1C:
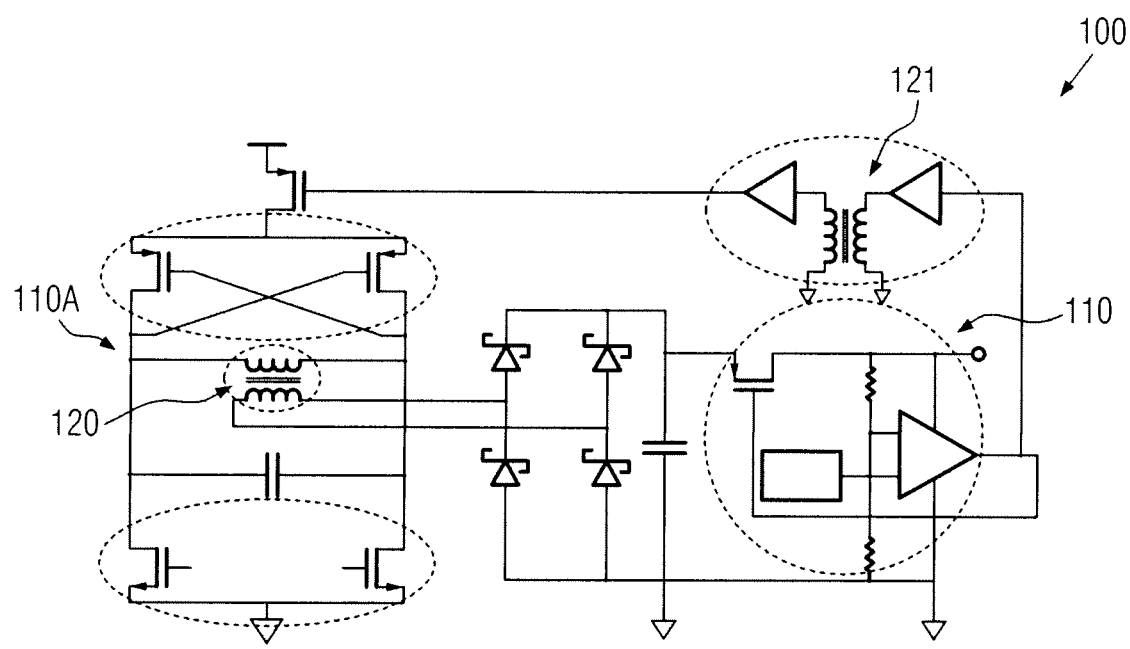
FIGS. 1c and 1d schematically illustrate a conventional chip scale DC-DC converter.
Figure 1D:
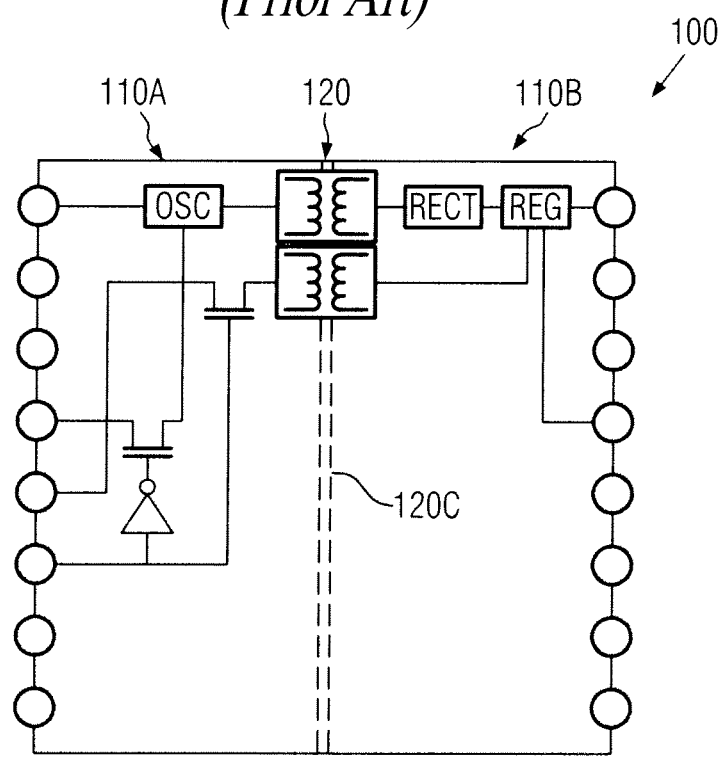
Figure 2A:
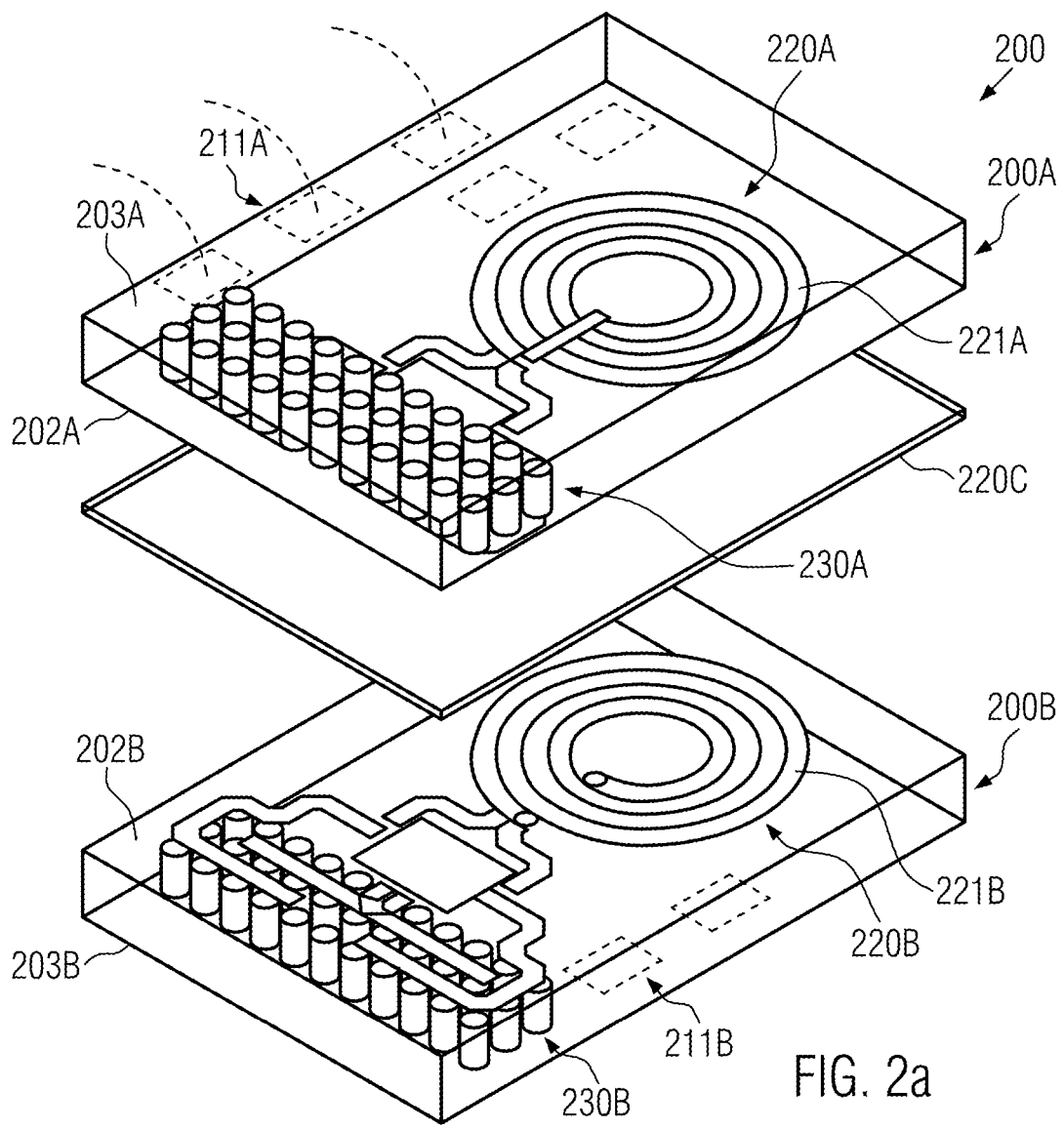
FIG. 2a schematically illustrates a perspective elevated view of a semiconductor device comprising a stacked chip configuration and an integrated coupling mechanism according to one embodiment.

FIG. 2a schematically illustrates a perspective elevated view of a semiconductor device 200 that comprises a first chip 200a and a second chip 200b, which may also be referred to as semiconductor chips, since typically a significant portion of the chips 200a, 200b may be comprised of a semiconductor material, such as silicon and the like. For convenience, respective substrate materials 201a, 201b of the chips 200a, 200b may be referred to as silicon substrates, however without intending to restrict the device 200 to silicon substrates, since any other appropriate materials may also be used. Typically, the substrate 201a may comprise a front side 202a and a back side or a rear side 203a, wherein typically the front side 202a may be understood as the side of the substrate 201a in and above which semiconductor-based circuit elements, such as transistors and the like, may be provided. Similarly, the substrate 201b comprises a front side 202b and a rear side 203b. It should be appreciated that semiconductor-based circuit elements may be formed in one or both of the chips 200a, 200b in order to provide appropriate circuitry, at least a portion of which is to be coupled in a non-galvanic manner, as is also explained above. For example, in the embodiment shown, corresponding circuit portions may be represented by coupling elements 220a, 220b while any other circuit elements may not be provided in some cases, while in other cases any appropriate circuitry for connecting to at least one of the coupling elements 220a, 220b may be provided on the basis of any appropriate circuit design and manufacturing technology, as will be described below in more detail. In the embodiment shown in FIG. 2a, the coupling elements 220a, 220b are provided in the form of metal regions or metal spirals thereby providing for a desired inductance. That is, in the embodiment shown, the spirals 220a, 220b, may be coupled so as to obtain a lateral coil configuration for forming a micro transformer upon connecting the chips 200a and 200b with an intermediate isolation layer 220c, which may thus provide for a desired galvanic separation of respective circuit portions, such as the coupling element 220a on the one hand, and the coupling element 220b on the other hand. It should be appreciated that typically the coupling elements 220a, 220b may have an inductive component and a capacitive component, in addition to a parasitic ohmic resistance, wherein the coupling mechanism may be dominated, for instance by inductance or capacitance, depending on the overall configuration of the coupling elements 220a, 220b and the operating mode, such as operating frequency and the like.

The coupling element 220a is provided within any appropriate device level of the chip 200a, for instance embedded or formed above a semiconductor material or provided as a metal-containing element formed in a metallization system (not shown) wherein the coupling element 220a may be formed together with other metal lines. In the embodiment shown in FIG. 2a, the coupling element 220a are provided in a single device level, for instance in a single metallization layer, while in other illustrative embodiments (not shown) corresponding windings or spirals may be provided in different stacked metallization levels, which may be connected by appropriate vias, thereby forming a non-planar transformer coil, if considered appropriate.

Similar considerations also apply to the coupling element 220b of the second chip 200b, wherein generally the coupling elements 220a and 220b may represent complementary coupling elements in the sense that the basic geometric configuration and the positioning of these coupling elements is selected such that a desired degree of coupling may be achieved upon connecting the chips 200a and 200b in combination with the isolation layer 220c. In order to provide connectivity to any peripheral components, such as to a package and the like, one or more conductive through-hole vias 230a are provided in the substrate 201a and similarly conductive through-hole vias 230b are provided in the substrate 201b. These vias thus represent "vertical" electrical connections for connecting the rear side 230a, 230b with the corresponding front side 202a, 202b. That is, these vertical connections provide electrical contact to any circuit elements and in particular to the corresponding coupling elements 220a or 220b formed in and above the corresponding front sides 202a, 202b by applying an appropriate back side metallization (not shown), which in turn may allow connection to the periphery, as schematically indicated by 211a in order to connect the coupling elements 220a with a carrier substrate, a package and the like. The connection 211a may be implemented in the form of bond wires, solder bumps or generally bumps, and the like. On the other hand, the through-hole via(s) 230b may connect to the contact structure, schematically indicated as 211b, such as a bump structure, bond wires, and the like, in order to allow communication of the chip 200b with the carrier substrate, the package and the like. Corresponding structures for connecting to a package substrate will be described in more detail later on in the context with process techniques for forming appropriate metallization systems.

Figure 2B:
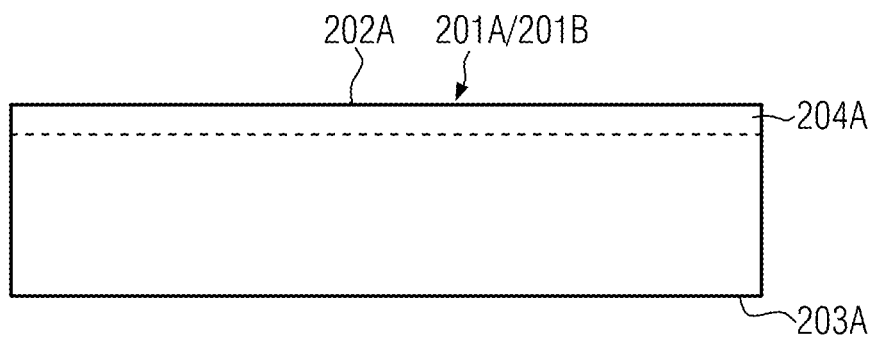
Figure 2C:
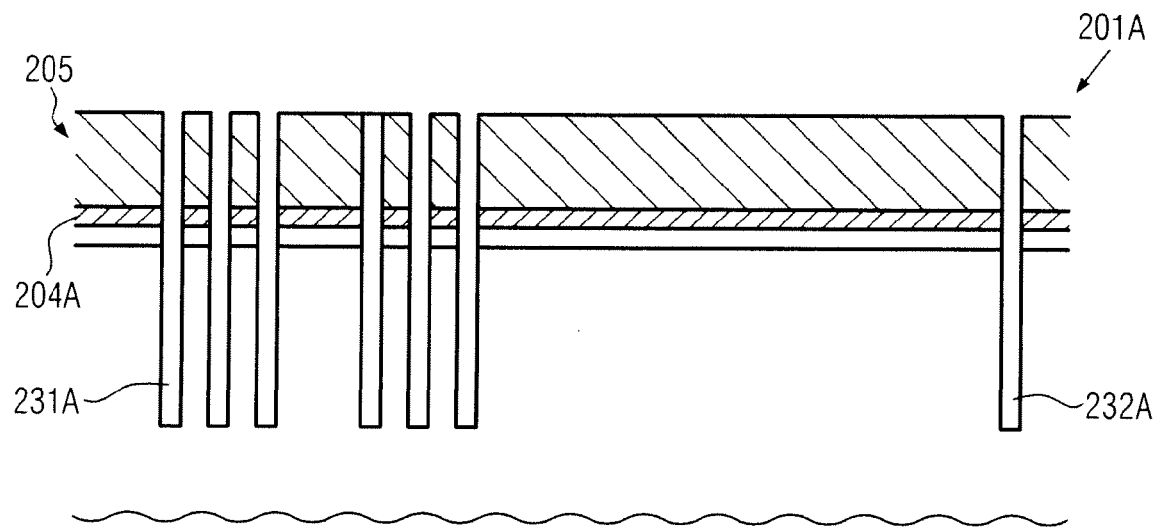
Figure 2D:
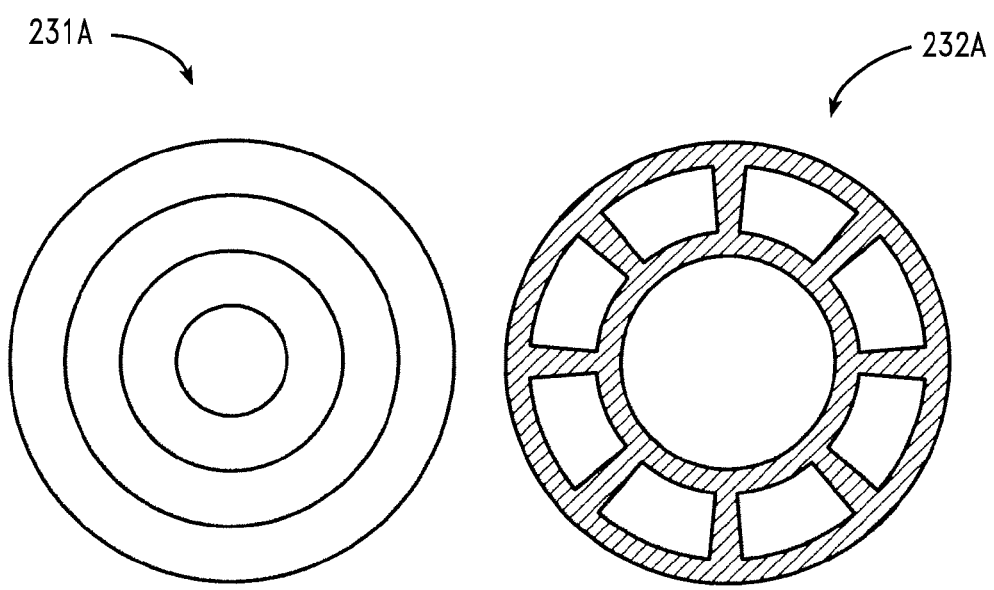
Figure 2J:
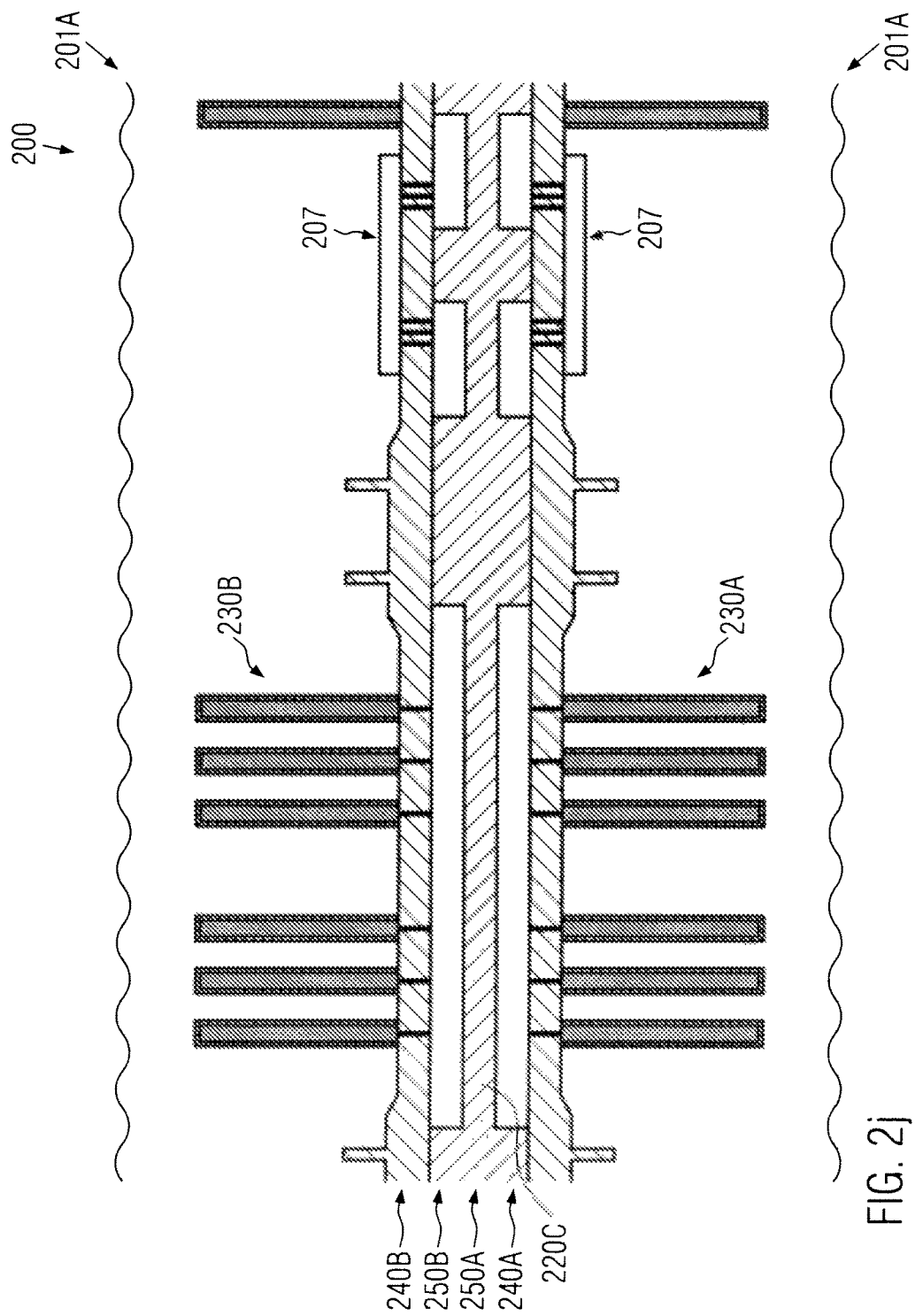
Figure 2K:
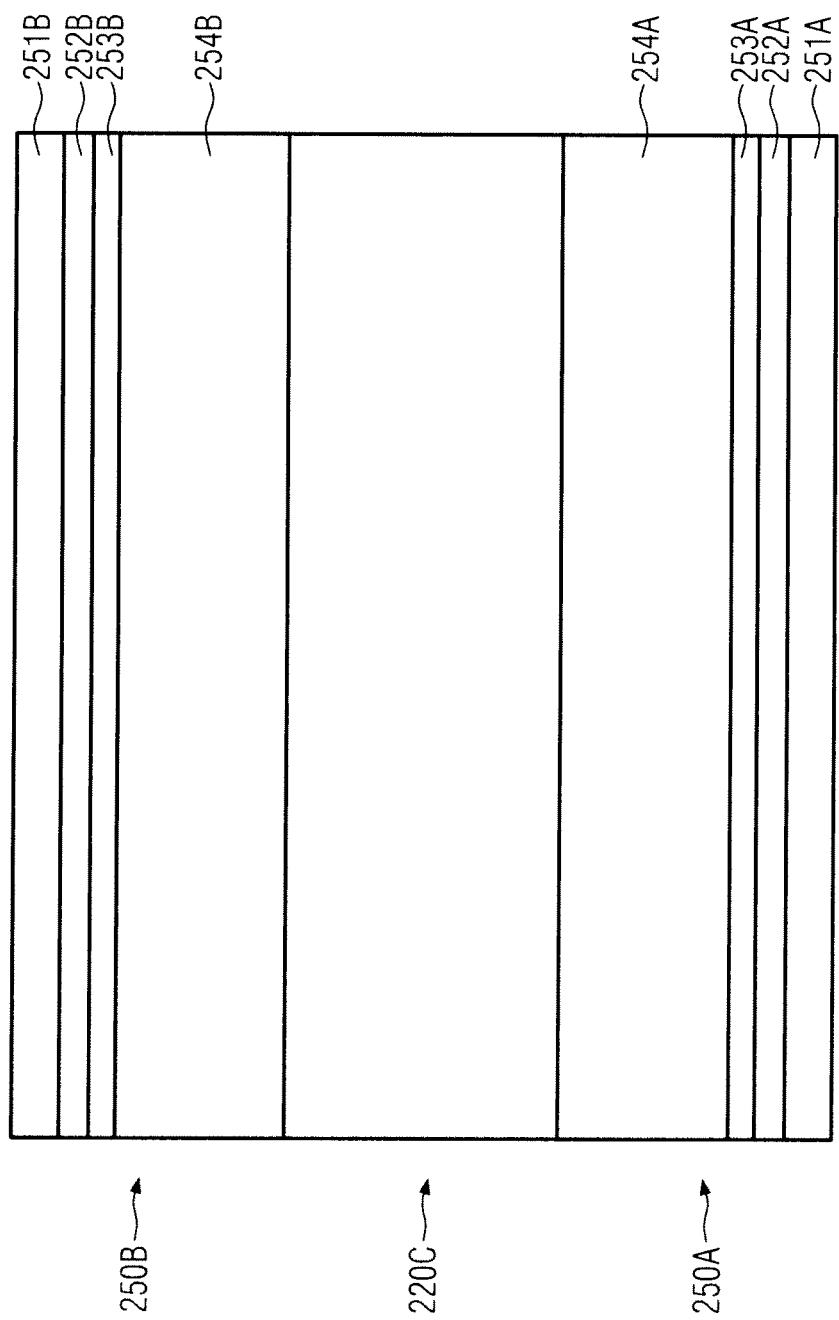
Figure 2I:
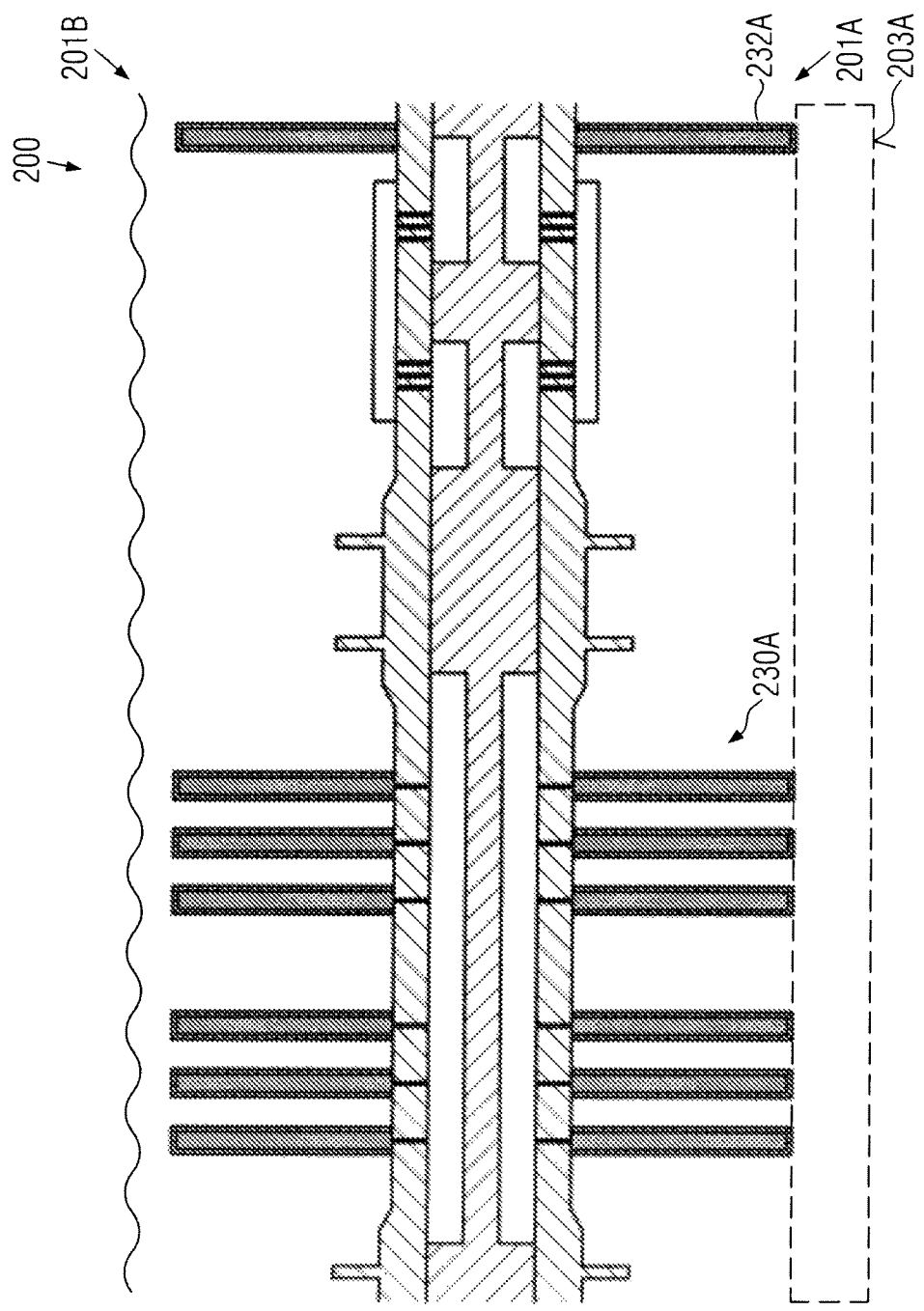
Figure 2M:
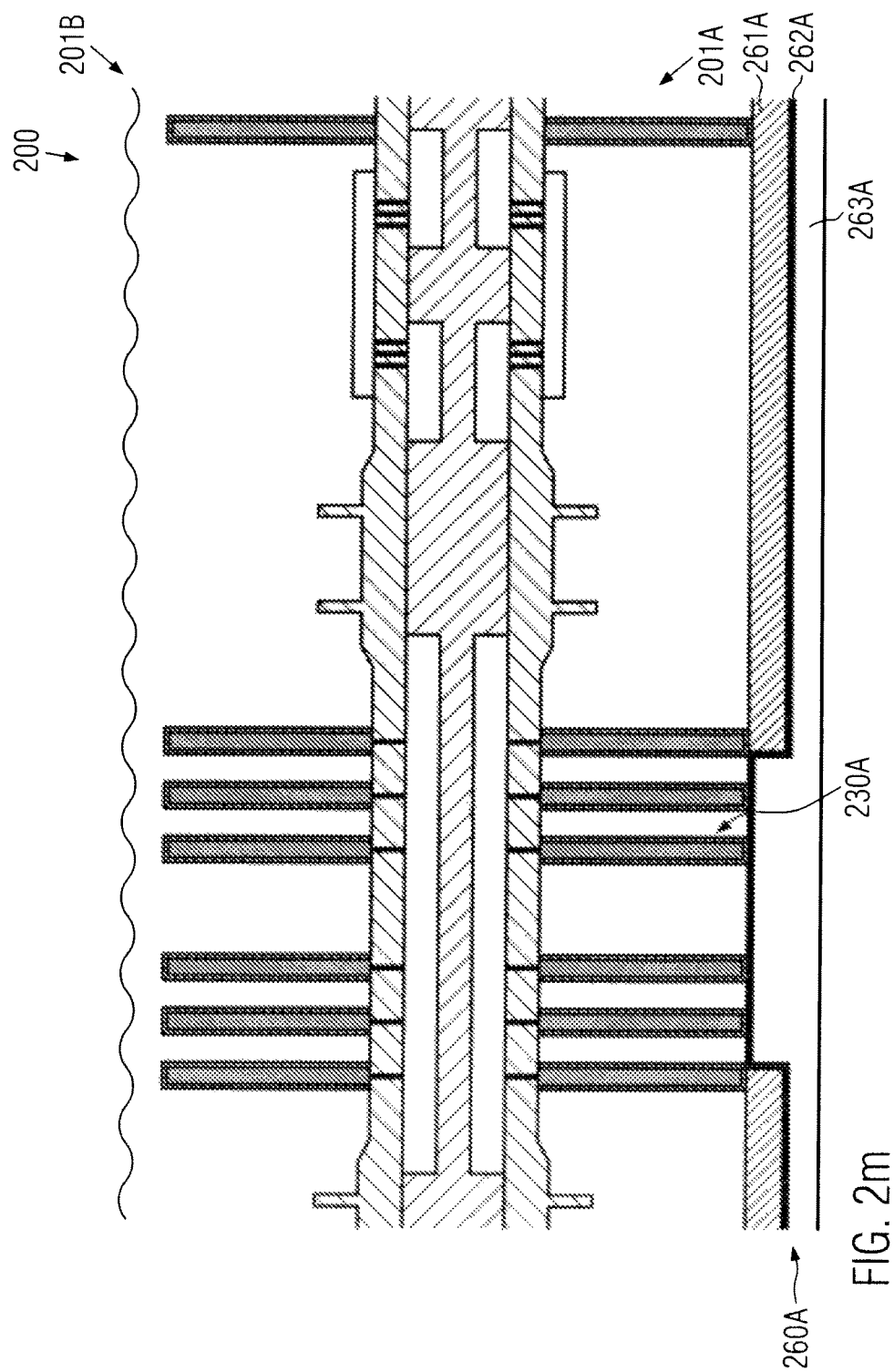
Figure 2N:
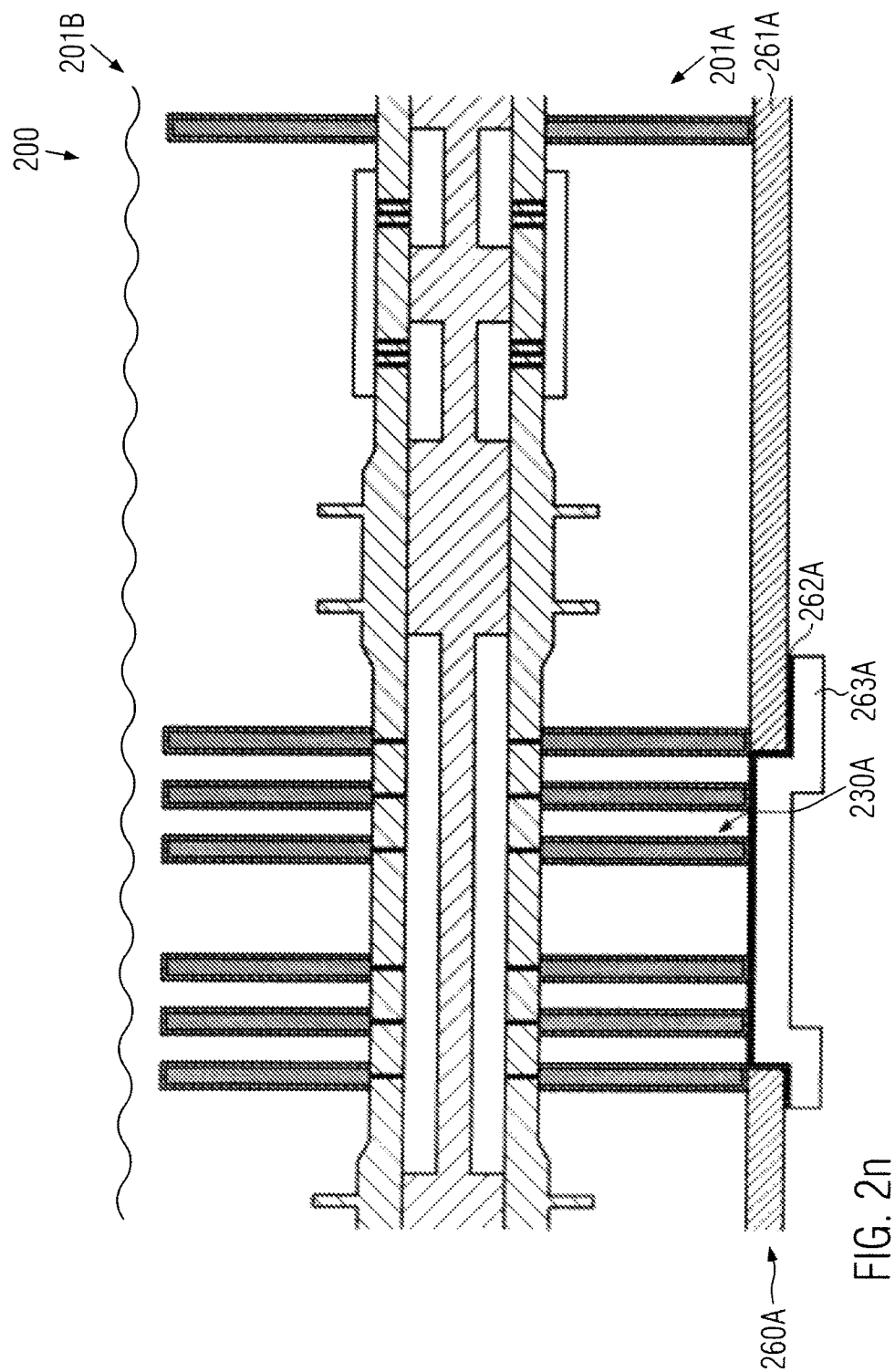
Figure 2P:
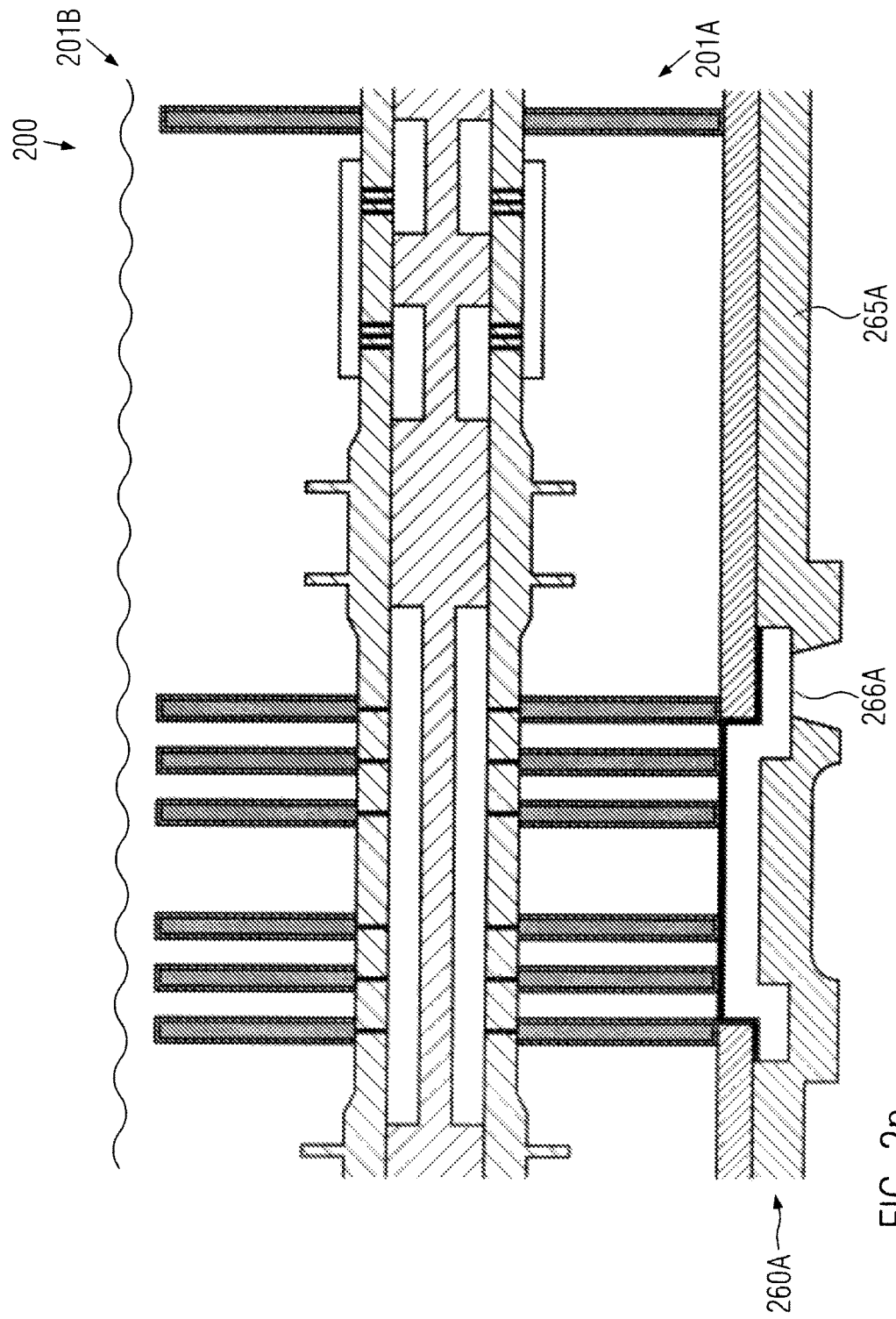
Figure 2Q:
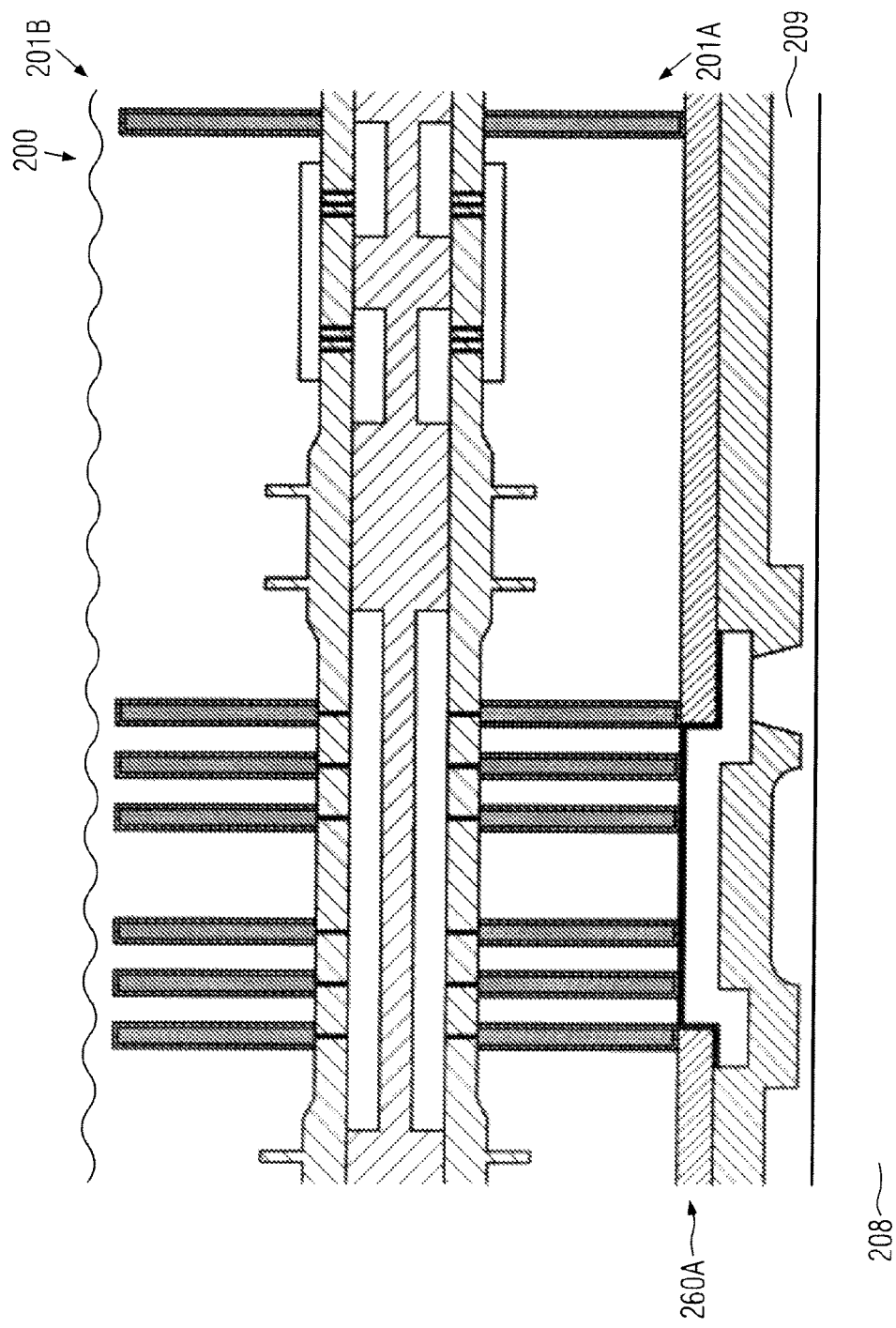
Figure 2R:
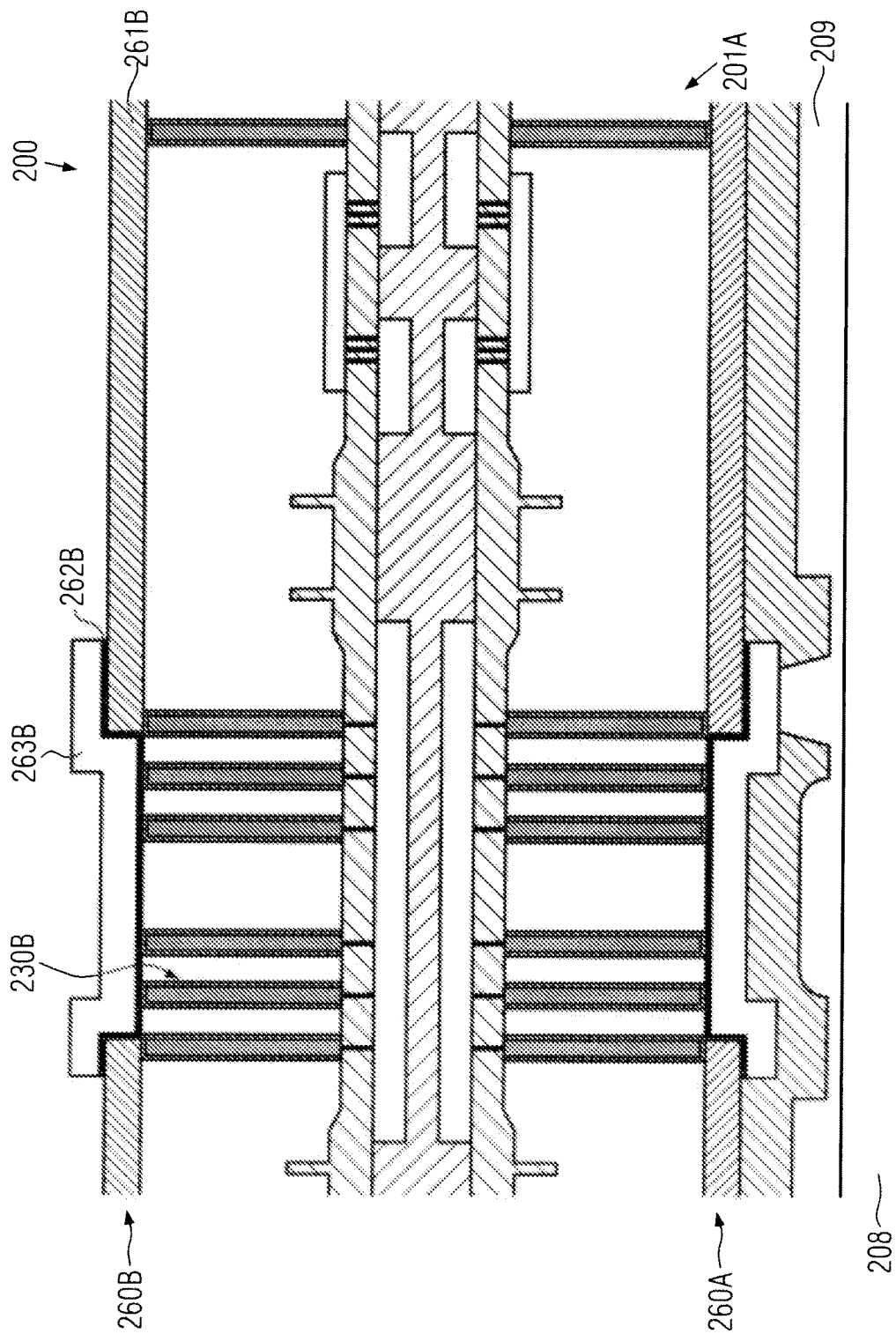
Figure 2S:
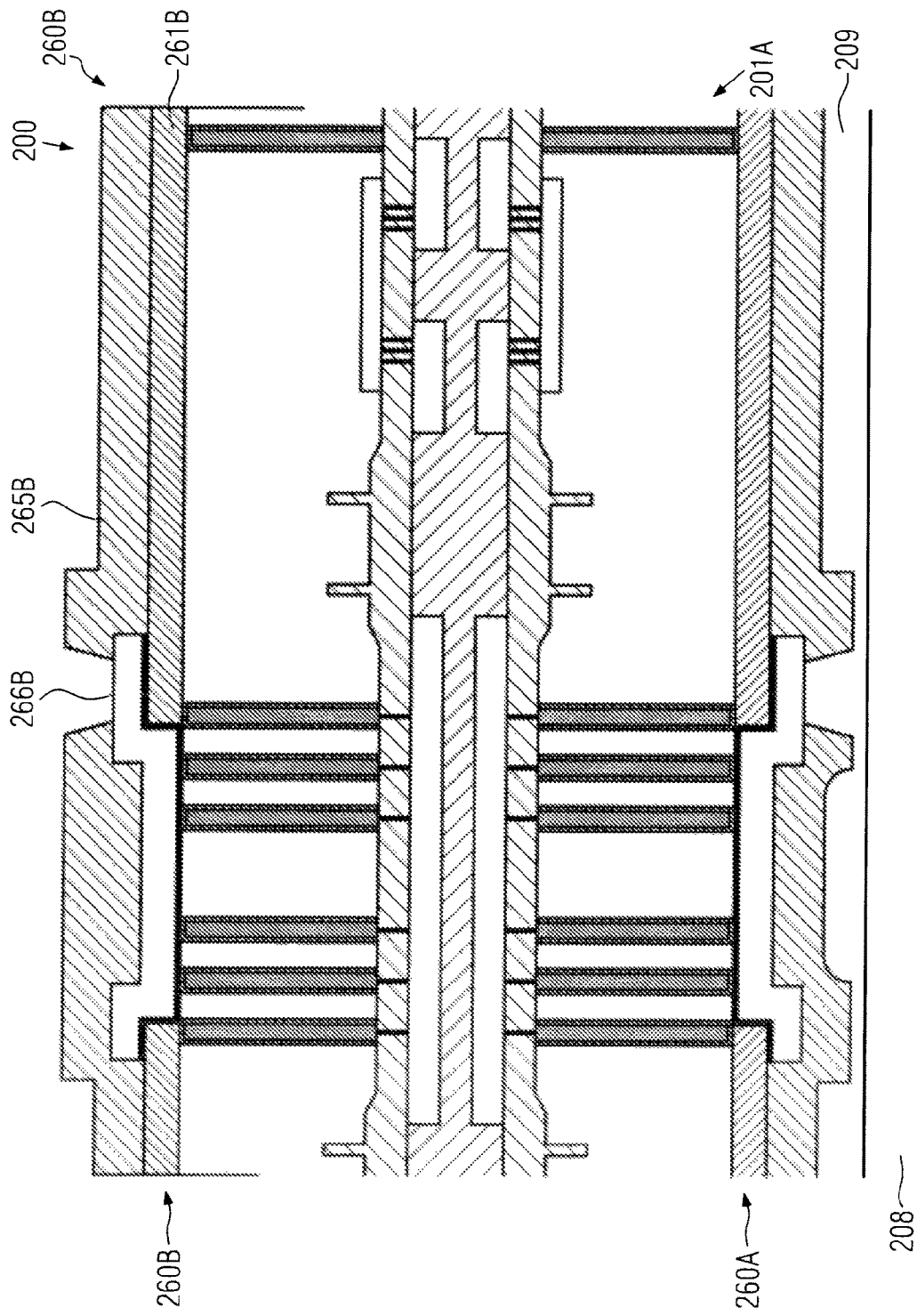
Figure 2T:
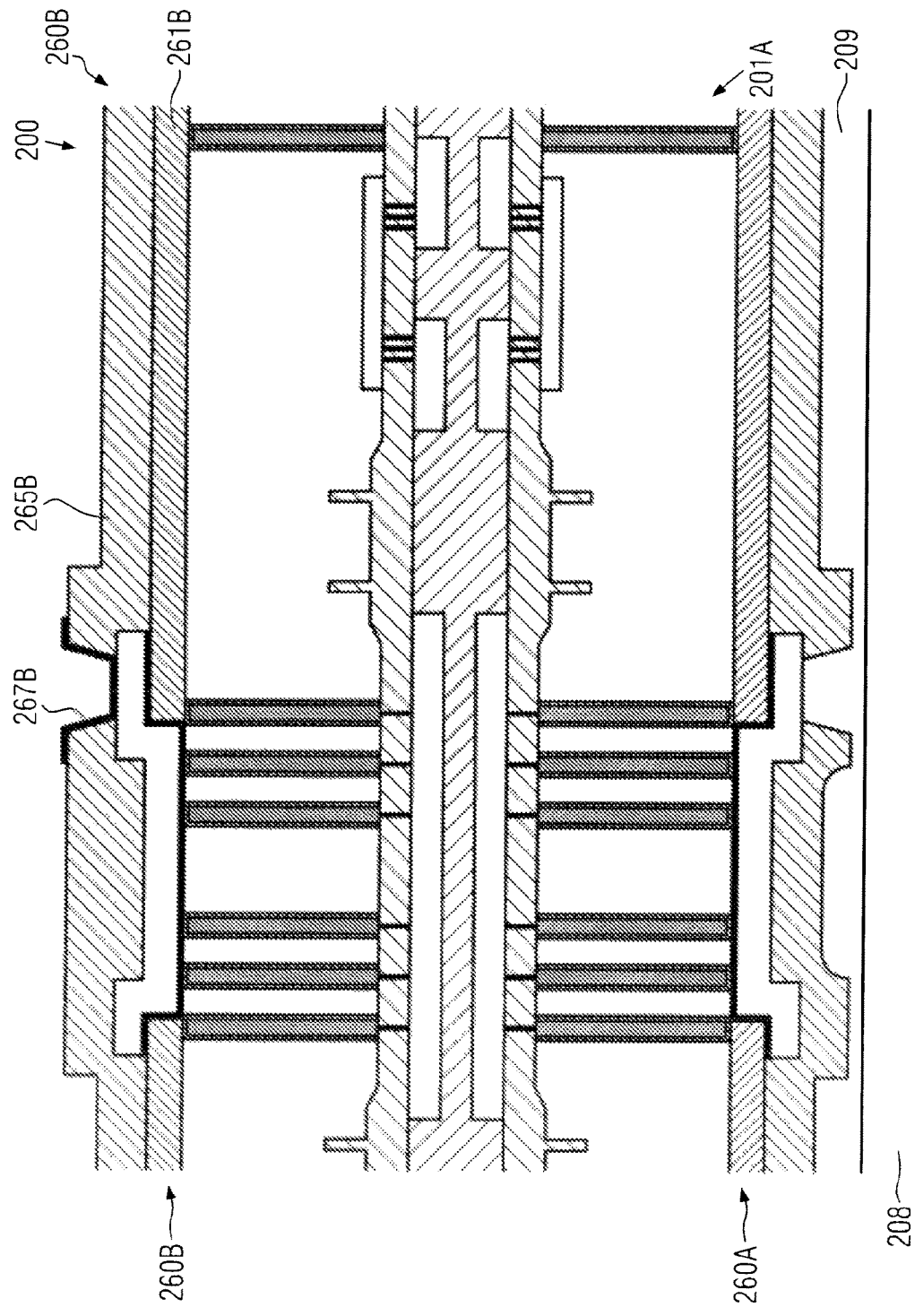
Figure 2U:
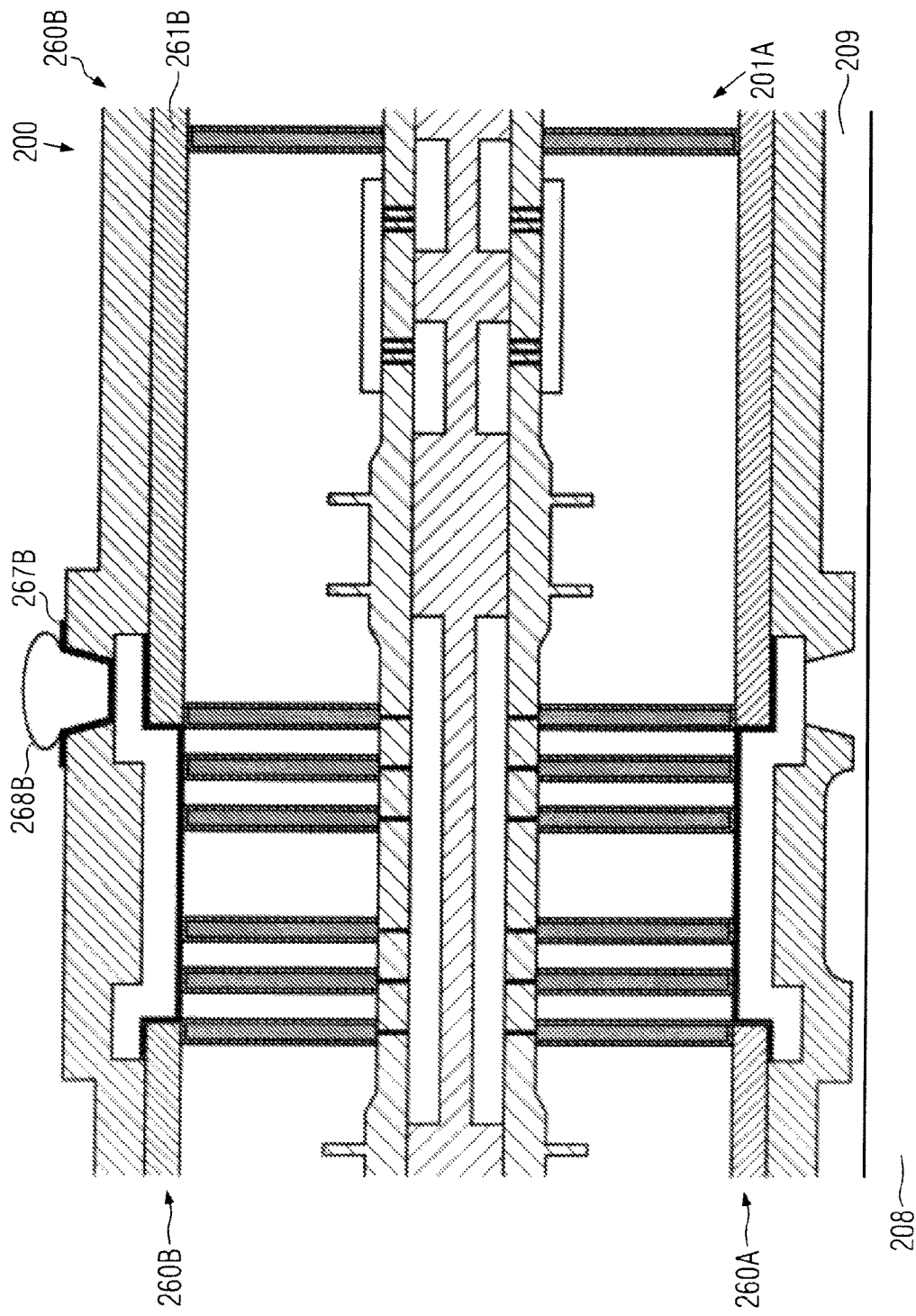
Figure 2V:
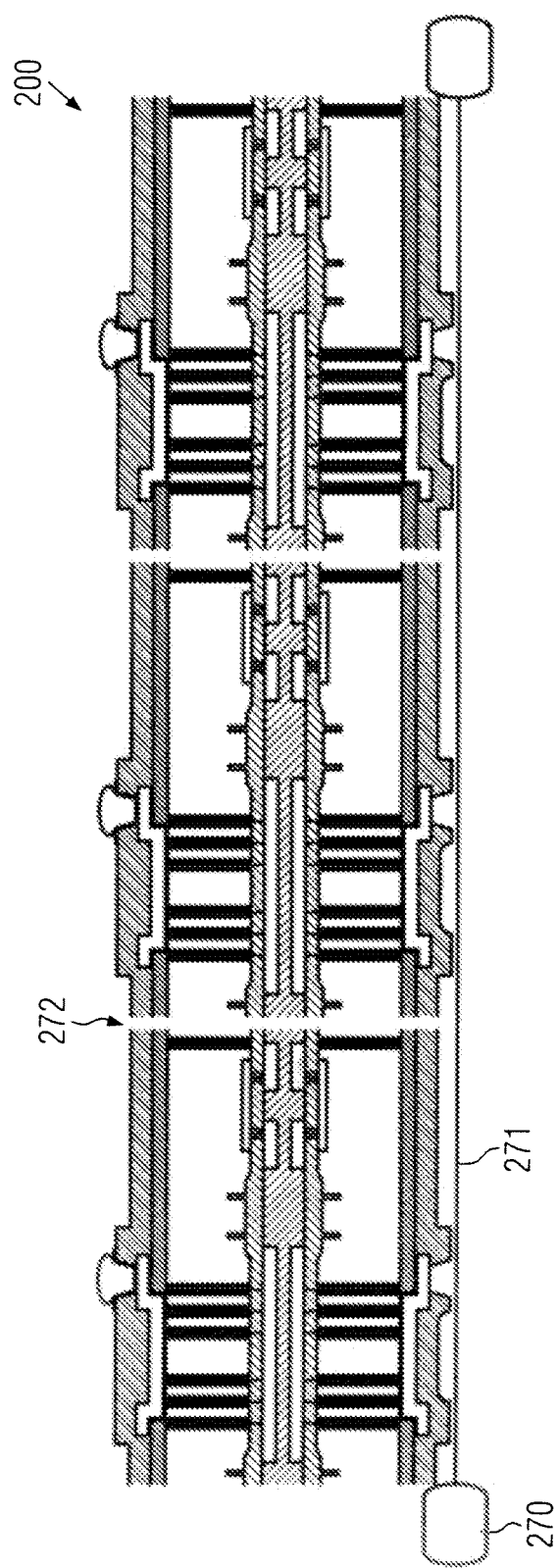
FIG. 2v schematically illustrates a cross-sectional view of the composite semiconductor device in a further advanced manufacturing stage when separating the stacked wafer configuration into single semiconductor devices according to one embodiment.

With reference to FIGS. 2b-2v appropriate process techniques will now be described in order to provide the semiconductor device 200 as a stacked chip configuration, as is for instance illustrated in a basic configuration in FIG. 2a.

FIG. 2b schematically illustrates a cross-sectional view of one of the substrates 201a, 201b in the form of a first wafer and a second wafer, which will also be denoted by the reference numerals 201a, 201b, respectively. The following processing may be performed on wafer level, i.e., the substrate 201a may represent a plurality of chips 200a, while the substrate 201b may represent a plurality of chips 200b. For convenience, it may be referred to the wafer or substrate 201a. As shown, a semiconductor layer 204a is provided so as to represent a portion of the substrate 201a, for instance in order to provide for superior crystal quality and the like. Thus the semiconductor layer 204a represents the front side 202a of the substrate 201a and is used for forming therein and thereabove semiconductor-based circuit elements, such as transistors and the like. For example, the semiconductor layer 204a may have any appropriate thickness so as to comply with the specifications for any circuit elements to be formed therein and thereabove. In the embodiment shown, the thickness may be approximately 10 μm or less, while the entire thickness of the substrate 201a may be several hundred μm. In the manufacturing stage shown, the semiconductor layer 204a and/or the remaining portion of the substrate 201a may comprise appropriately dimensioned and positioned implantation regions for the further processing of the device 200. To this end, any appropriate manufacturing techniques are applied, such as lithography processes for providing implantation masks, implantation processes for incorporating appropriate dopant species, followed by any thermal treatments upon epitaxially growing additional material of the semiconductor layer 204a and the like. In some illustrative embodiments, a protective material layer such as a silicon dioxide material and the like may be provided locally at the edge of the substrate 201a in order to reduce any damage during the subsequent processing when forming the through-hole vias. For this purpose, appropriate deposition and/or deposition techniques may be applied in combination with appropriate patterning regimes.

FIG. 2c schematically illustrates a cross-sectional view of the substrate 201a in a further advanced manufacturing stage. In this stage, via openings 231a are formed so as to extend into the substrate 201a. To this end, an appropriate etch mask 205 is provided, for instance in the form of a hard mask material, such as silicon dioxide possibly in combination with silicon nitride, resist and the like. It should be appreciated that corresponding silicon-based dielectric materials are well-established and may efficiently be used for patterning a silicon material, since a plurality of selective etch recipes are available for silicon dioxide, silicon nitride and silicon. The etch mask 205 may be patterned on the basis of corresponding lithography techniques, thereby defining the lateral size, shape and position of the via openings 231a. In addition to the "regular" via openings 231a, also one or more openings 232a are provided, which may be considered as through-hole vias that are used as direct alignment marks during the further processing. The via openings 231a, 232a may be formed on the basis of well-established plasma assisted etch recipes, or based on any appropriate processes, such as etch and deposition sequences and the like, in order to provide the via openings 231a having the desired lateral size and shape. It should be appreciated that a plurality of etch recipes for forming deep trenches in a silicon material are well-established in the art and may be used for forming the via openings 231a, 232a.

FIG. 2d schematically illustrates a top view of possible lateral configurations of the via openings 231a, 232a. For example, these openings may be formed as concentric ring segments or rings, or any other geometrical shape, or a combination thereof which may be advantageous in view of stress compensation, process robustness and the like. It should be appreciated however that any appropriate configuration of the via openings 231a, 232a may be selected and also the total lateral size thereof can be adjusted with respect to device specifications, for instance in terms of electrical conductivity and the like.

FIG. 2e schematically illustrates the substrate 201a in a manufacturing stage in which an insulating material layer 233a is formed within the via openings 231a. The insulating material 233a may be provided in the form of, for instance, silicon dioxide material with an appropriate thickness to provide for the desired dielectric characteristics. In other cases, the layer 233a may be comprised of other appropriate materials, such as silicon nitride, or a combination of silicon dioxide, silicon nitride and the like. In some illustrative embodiments the dielectric layer 233a may be formed by thermally activated processes using oxidation and/or deposition techniques thereby forming, for instance, the layer 233a with an average thickness within the via openings 231a of approximately 10-5000 nm. In other illustrative embodiments the layer 233a may be formed by deposition, for instance sub atmospheric CVD, in which moderately high deposition rates may be obtained with superior coverage within the high aspect ratio vias 231a. In still other cases, a thermal oxide layer may be combined with a CVD layer, thereby also resulting in reliable coverage of any sidewall areas of the via openings 231a. Another option for the vias sidewalls insulation is the use of deposited polymeric material, organic or inorganic, exploiting all the available techniques able to cover vertical trenches.

In FIG. 2f a first portion of a conductive fill material 234 is provided above the substrate 201a and within the via openings 231a. For example, the fill material 234a may comprise a highly doped polysilicon material, which may be deposited on the basis of low pressure CVD techniques, which are well-established in the art for providing a silicon material. Moreover, during the deposition process an appropriate dopant precursor species is incorporated into the deposition atmosphere, thereby obtaining a desired high degree of doping and thus superior conductivity of the material 234a. Thereafter, an etch process may be applied in order to etch back the material layer 234a and thus provide for superior conditions for the subsequent deposition of a further portion of the conductive fill material 234. As conductive filler material metals deposited by electrochemical process but also polymer could be used. For this step all the available techniques, present in the state-of-the-art, able to fill the trenches can be exploited.

FIG. 2g schematically illustrates the substrate 201a wherein the through-hole vias 230a comprise the fill material 234a, for instance in the form of the highly doped polysilicon material, as described above, wherein a substantially planar surface topography may have been obtained by any appropriate planarization process. The materials previously deposited as hard mask for the trenches opening will be used as stopping layer during the CMP or other planarization technique in order to avoid any surface damaging of the substrate. After the planarization process a selective etching could be used in order to remove the dielectric material 233a from above the substrate 201a, thereby exposing a semiconductor layer 204a without any defect on the top surface. To this end, well-established process techniques, such as CMP (chemical mechanical polishing) or dry polishing and the like may be used. It should be appreciated that the "through-hole vias" 230a may extend into the substrate 201a to a specific depth, which may be greater than a desired final thickness of the substrate 201a. For example, the vias 230a may extend into the substrate 201a with a depth of greater than 100 μm when a final thickness of 100 μm is desired. It should be appreciated however that any other depth of the vias 233a and thus of the final thickness of the substrate 201a may be selected.

By providing through-hole vias 230a in an early manufacturing stage, any influence on other circuit elements which may be formed in and above the semiconductor layer 204a in the subsequent process stages may substantially be avoided. Consequently, the process steps for forming an etch mask and patterning the substrate 201a and the corresponding processes for removing excess material may substantially not affect other device areas. By providing the conductive fill material 234a in the form of, for instance, highly doped silicon material a high temperature compatibility of the vias 230a is accomplished, as may be suitable for forming further circuit elements since in this case high temperature processes are sometimes performed. In other illustrative embodiments, the conductive fill material 234a is provided in the form of a carbon material, which may be deposited in a highly conductive state on the basis of well-established CVD techniques, thereby providing for a high base conductivity, which may thus generally allow reducing the lateral dimensions of the vias 230a. Furthermore, the conductivity of the carbon material may further be increased by incorporating appropriate dopant species, which may be accomplished by incorporating the precursor materials into the deposition atmosphere. Since the carbon material also exhibits excellent high temperature characteristics, any further high temperature processes do not significantly affect the vias 230a.

It should be noted that the substrate 201b (cf. FIG. 2a) may be processed in a similar manner, if the corresponding through-hole vias are to be provided in an early manufacturing stage. In other cases, however, the through-hole vias in the substrates 201a, 201b may be provided with different configurations and/or in different stages of the overall manufacturing process, depending on the process technology used for forming the chips 200a, 200b, which may significantly differ depending on the circuit portions to be implemented in and above the corresponding semiconductor chips.

For example, in some cases the through-hole vias may be provided in a later manufacturing stage, for instance when forming a metallization system, thereby providing for the possibility of using highly conductive metal or metal compounds as the fill material 234a. In still other cases, fill materials on the basis of polymer may be used at any appropriate manufacturing stage, i.e., after any high temperature processes, for instance by taking advantage of the characteristics of functional molecules and the like.

FIG. 2h schematically illustrates the substrate 201a in a further advanced manufacturing stage. As illustrated, after completing the through-hole vias 230a in a specific device area 207 in accordance with the overall device specifications, any "standard" process techniques may be applied for forming circuit elements or at least the coupling elements on the basis of a desired process technology. For example, in this manufacturing stage any processes for forming deep trenches for isolating the various semiconductor-based circuit elements and device areas may be applied on the basis of process techniques including lithography and etch processes. Thereafter, an appropriate masking regime in combination with implantation processes may be applied so as to obtain the desired dopant profiles in a device area 206, in which semiconductor-based circuit elements, such as transistors and the like, may be provided. Principles of the present disclosure are compatible with any process technological platform, such as bi-polar process technologies, CMOS, DMOS or any combination thereof for implementing the circuitry under consideration. As discussed above, typically types of circuitry, such as digital circuitry, analogue circuitry, power circuitry and the like, may be combined in complex semiconductor devices wherein, however, any of these process techniques may be applied without being affected by the presence of the through-hole vias 230a.

FIG. 2i schematically illustrates the substrate 201a in a further advanced manufacturing stage in which semiconductor-based circuit elements, generally indicated as 207, are provided in the device area 206. As discussed above, the circuit elements 207 may represent any appropriate type of circuitry formed on the basis of any appropriate process technology. Furthermore, a metallization system 240a is provided with a configuration so as to appropriately connect to the circuit elements 207 and also to connect to the through-hole vias 230a in order to provide for the desired connectivity of the circuit elements 207 to the periphery, if desired, and also to connect any coupling elements such as the coupling elements 220a, 221a (cf. FIG. 2a), which may be provided in the metallization system 240a. The metallization system 240a may typically comprise a contact level including a dielectric material 241, for instance in the form of silicon dioxide, silicon nitride and the like, in which contact elements 242 are provided, for instance as tungsten elements and the like, so as to connect to the highly doped semiconductor materials in the through-hole vias 230a and the circuit elements 207. It should be appreciated that additional contact areas of superior conductivity, for instance in the form of a metal silicide, may be provided in the through-hole vias 230a and/or the circuit elements 207, if compatible with the process strategy used for forming the contact elements 207. Moreover, the metallization system 240a may comprise a plurality of metal regions 244, 243, which may be provided in a single metallization layer or in a plurality of stacked metallization layers, in order to establish the network of electrical connections according to the basic circuit configuration. For example, the metal regions 243a, 244a may comprise highly conductive metals such as aluminium, copper, copper/aluminium and the like, depending on the process technology used. It should be appreciated that in some illustrative embodiments the metal regions 243a, 244a may appropriately be patterned so as to obtain the coupling elements 220a, 221a having the desired lateral size and configuration. For example, metals spirals, metal windings and the like are formed in the metallization system 240a, for instance in an uppermost metal level, if a plurality of metallization layers are provided in the system 240a. In other cases, as discussed above, respective combined metal regions can be provided in several stacked metallization layers, if considered appropriate. The metallization system 240a is embedded in a passivation layer stack 250a which may comprise one or more appropriate dielectric material layers, depending on the overall process strategy. Furthermore, a thickness 250t of the passivation layer stack 250a is adjusted in accordance with overall process considerations, for instance in terms of integrity of the metallization system 240a and the like. It should be appreciated that for a given composition of the final passivation layer stack 250a and for a given configuration of the metallization system 240a the final characteristics of the coupling elements 220a, 221a in combination with the complementary coupling elements of the second chip (cf. FIG. 2a) can efficiently be adjusted on the basis of an additional dielectric material, which may be used for bonding the substrate 201a to the substrate 201b (cf. FIG. 2a). It is important to underline that all these operations and steps are carried-out at wafer level. To create the final structure a wafer comprising all the circuitry for the primary section will be faced to another similar wafer comprising all the secondary stage circuits, and will be aligned with micrometric precision, exploiting combination of lithography and bonding techniques in order to guarantee high matching factor between primary and secondary. As mentioned all these processes will be performed at wafer level, in other words on some thousands of devices at the same time.

The adhesive material will act in addition to the final passivation layers of the two wafers as a dielectric stack between the primary and secondary stages. The tuning of the thickness of each layer but also the kind of the used materials will guarantee high flexibility for the range of voltage withstanding between the two parts.

As previously discussed, in some cases the through-hole vias 230a may be formed during the fabrication of the metallization system 240a, which may include corresponding masking steps when etching through the metallization system 240a and into the substrate 201a in order to protect, for instance, the device area 206. Thereafter, the through-hole via openings may be filled with any appropriate conductive material, such as metals, polymers and the like, and subsequently any excess material may be removed, possibly in combination with the etch mask materials.

Similarly, the second chip may be processed so as to have incorporated therein the through-hole vias and the corresponding coupling elements, wherein generally the same or different process technologies and different designs for the through-hole vias and/or the coupling elements may be used, as discussed above. Consequently, in this manufacturing stage, individual substrates 201a, 201b may substantially be completely processed in view of any circuit elements and the coupling elements and may have formed thereon corresponding metallization systems and a passivation layer stack, such as the layer stack 250.

FIG. 2j schematically illustrates the substrates 201b, 201a in a bonded state, thereby forming the composite semiconductor device 200. It should be appreciated that the device 200 still may be provided at wafer level, that is, a plurality of the substrates 200 are provided on the wafer composite formed by bonding the substrates 201b, 201a. For convenience, in FIG. 2j a single semiconductor device is illustrated. Thus, the substrate 201b may have incorporated therein appropriate circuit elements 207b and a metallization system 250b, which is covered by an appropriate passivation layer stack 250b. With respect to any process techniques for forming the substrate 201b, the same criteria apply as previously discussed with respect to the substrate 201a. Furthermore, in the bonded state an additional permanent adhesive material 220c is provided so as to thermally connect the substrates 201b, 201a. Thus, in the embodiment shown the substrates 201a, 201b may be connected "face to face", that is, the corresponding metallization systems 240a, 240b, as well as the circuit elements 207a, 207b, face each other. The adhesive material 220c may comprise any appropriate adhesive material, as is well known in the art. The substrates 201a, 201b may be bonded by applying the material 220c on one or both of the passivation materials 250a, 250b and applying elevated temperatures and/or pressure in order to mechanically contact the substrates 201a, 201b. Upon aligning the substrates 201a, 201b, the alignment marks 232a, 232b may efficiently be used thereby ensuring proper alignment of any coupling elements in the metallization systems 240a, 240b.

FIG. 2k schematically illustrates the passivation layer stacks 250b and 250a in more detail, while the adhesive material 220c provides for a firm mechanical contact of the layer stacks 250a, 250b. As illustrated, a plurality of dielectric materials, for instance in the form of silicon dioxide, silicon nitride, silicon oxynitride, polyimide, BCB, and the like, may be provided, as indicated by the various sub layers 251a, 252a, 253a, 254a for the layer stack 250a and by the materials 251b, 252b, 253b, 254b for the layer stack 250b. It should be appreciated however that the layer stacks 250a, 250b may have a different composition. Consequently, by providing a given composition of the layer stacks 250a, 250b a thickness and material composition of the adhesive material 220c may be selected such that a desired degree of non-galvanic coupling may be achieved for the coupling elements in the respective metallization systems.

FIG. 2l schematically illustrates the device 200 in a further advanced manufacturing stage in which a portion of the substrate 201a is removed from the rear side 203a, which may be accomplished by etching, CMP, dry polishing and the like, thereby finally exposing the through-hole vias 230a and also the direct alignment marks 232a. Consequently, upon planarizing the rear side 203a and conditioning the surface, further processing may be continued by forming a back side metallization which may start with the position of an appropriate dielectric material. To this end well-established low temperature deposition processes and/or oxidation processes may be applied, followed by appropriate patterning strategies in order to appropriately expose the through-hole vias 230a and corresponding areas for conductive lines to be formed at the rear side 203a.

FIG. 2m schematically illustrates the device 200 in a further advanced manufacturing stage in which a dielectric layer 261a, for instance in the form of an oxide material, is provided as a patterned layer in combination with one or more metal-containing materials, such as a layer 262a and a layer 263a, which may thus represent a portion of a back side metallization system 260a. For example, the layer 262a may be provided in the form of a titanium material, while the layer 263a may represent a highly conductive material, for instance in the form of an aluminium copper compound. Consequently, the titanium layer 262a may be used as an efficient barrier material while layer 263a may provide for high conductivity in order to reduce the overall series resistance in the semiconductor device 200. The material layers 262a, 263a may be formed on the basis of well-established deposition techniques such as sputter deposition or any other type of low temperature deposition techniques.

FIG. 2n schematically illustrates the layers 262a, 263a in a patterned state in order to establish the electrical connections between the plurality of through-hole vias 230a. To this end, corresponding lithography masks may be used in combination with any appropriate etch technique.

FIG. 2o schematically illustrates a top view of the rear side 203a wherein the layers 262a, 263a are appropriately patterned so as to connect the through-hole vias 230a.

FIG. 2p schematically illustrates the device 200 in a further advanced manufacturing stage in which a rear side passivation material 265 is applied and is patterned so as to expose appropriate contact or bump areas 266, which may be used in a later manufacturing stage so as to directly connect to a package substrate and the like. The material 265 may be provided in the form of polyamide and the like, possibly in combination with other materials, while a corresponding patterning thereof may be accomplished on the basis of well-established lithography techniques.

FIG. 2q schematically illustrates the device 200, still at wafer level, in a manufacturing stage in which an appropriate carrier substrate 208, such as a silicon substrate, may temporarily be attached to the back side metallization 260a, which may be accomplished by using an appropriate temporary adhesive material 209 that provides for efficient mechanical adhesion upon further processing the device 200 which, however, also allows efficient removal of the carrier substrate 208 in a further advanced manufacturing stage. To this end, a plurality of polymer materials and the like are available.

In FIG. 2r a back side metallization system 260b is provided in the form of patterned conductive layer 262b, for instance in the form of a barrier material, in combination with a patterned highly conductive metal layer 263b, such as an aluminium/copper layer, wherein these layers may appropriately be patterned so as to provide the desired connection and contact regime for the through-hole vias 230b. To this end, similar process techniques may be applied as previously discussed with reference to the substrate 201a. That is, a portion of the substrate 201b is removed, for instance by grinding in combination with a surface planarization, for instance in the form of CMP, thereby exposing the through-hole vias 230b and the direct alignment marks 232b at the rear side 203b.

FIG. 2s schematically illustrates the device 200 in a manufacturing stage in which the back side metallization 260b comprises a passivation material 265b in a patterned state in order to define corresponding contact areas 266b, which may be available for wire bonding, solder bumps and the like. Moreover, a dielectric material 261b, for instance in the form of a silicon dioxide material, is formed in a patterned manner above the rear side. The insulating material 261b may be deposited on the basis of low temperature deposition techniques and the patterning may be accomplished by any appropriate etch technique.

FIG. 2t schematically illustrates the back side metallization system 260b with an underbump metallization 267b, which may be comprised of any appropriate materials, such as titanium, tungsten, copper, chromium, gold and the like.

FIG. 2u schematically illustrates the device 200 in a further manufacturing stage, i.e., after the deposition of a solder bump 268b formed on the patterned underbump metallization 267b. To this end, any well-established plating techniques in combination with appropriate materials, such as lead-containing solder materials, lead-free materials and the like, may be used.

FIG. 2v schematically illustrates the device 200, still at wafer level, in a further advanced manufacturing stage. That is, after completing the back side metallization 260b, the carrier substrate 208 (cf. FIG. 2u) is removed and the composite wafer is installed on a carrier frame 270 having formed therein an adhesive tape 271, which in turn is used for dicing the wafer, as indicated by 272, thereby obtaining the individual semiconductor devices 200. To this end, any well-established process techniques may be applied. Prior to or after dicing the composite wafer electrical testing may be performed so as to obtain respective measurement data for assessing and controlling the overall process flow. Thereafter, the individual semiconductor devices 200 may be incorporated into appropriate package substrates by using appropriate contact regimes, for instance by using reflow processes and wire bonding techniques. Consequently, the manufacturing of the coupling elements in particular the stacking thereof is accomplished on wafer level.

FIG. 2w schematically illustrates a cross-sectional view of the semiconductor device 200 in a packaged state. As illustrated, the semiconductor chip 200a is attached to the semiconductor chip 200b via the dielectric insulating material 220c, which may be provided in the form of an adhesive, as discussed above. Moreover, one or more of the coupling elements 220a, for instance in the form of a primary coil, may be provided in the semiconductor chip 200a, for instance in the metallization system, as discussed above. Similarly, one or more of the coupling elements 220b, for instance in the form of a secondary coil, may be provided in a semiconductor chip 200b, for instance in the corresponding metallization system, as is also described above. The bonded semiconductor chips 200a, 200b are positioned in a package 280, which may comprise a package substrate 281 having an appropriate contact structures so as to directly connect to the back side metallization system 260b by means of the solder bumps 268b. On the other hand, the chip 200a may be connected to the carrier substrate 281 by means of bond wires 282, which may connect to the contact areas 266a provided in the back side metallization 260a, as previously discussed. Moreover, the package 280 may comprise any appropriate fill material 283, for instance in the form of a molding compound and the like.

The packaging of the semiconductor device 200 may be accomplished on the basis of well-established reflow process regimes and corresponding wire bonding techniques.

Figure 2X:
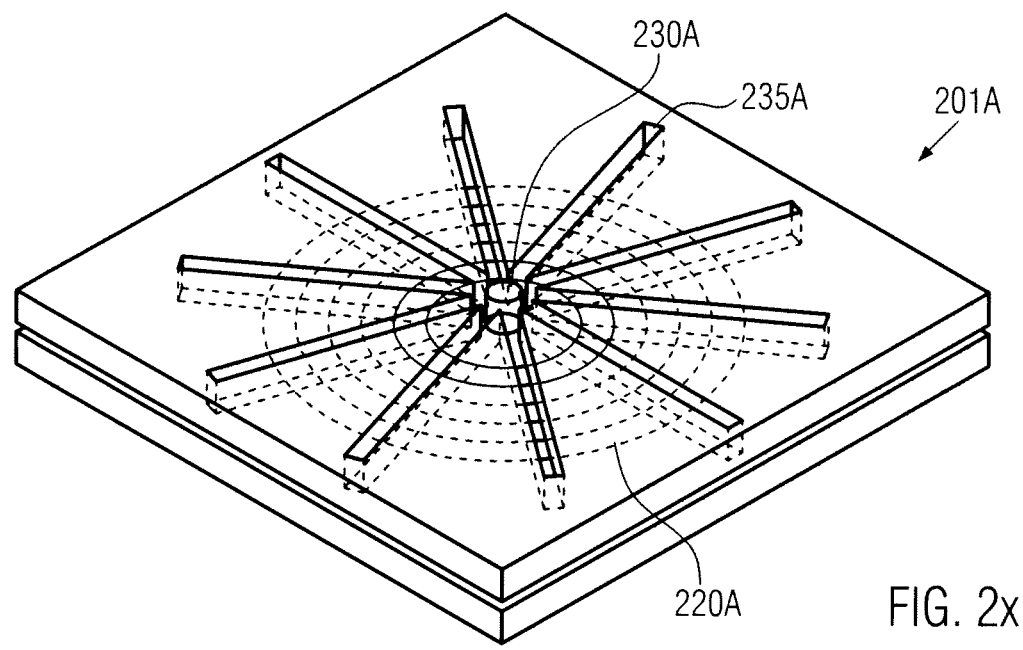
FIG. 2x schematically illustrates a perspective view of a portion of a substrate comprising isolation regions for reducing eddy currents according to one embodiment.
Figure 2Y:
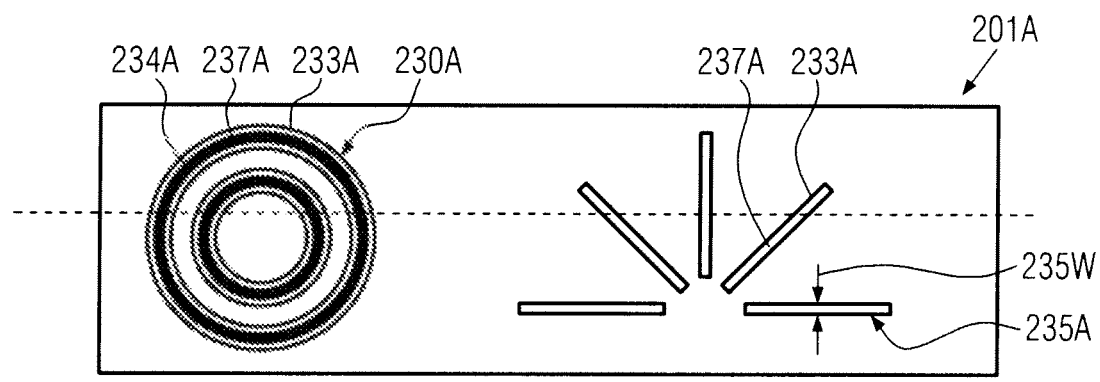
FIGS. 2y and 2z schematically illustrate a top view and a cross-sectional view, respectively, of a further arrangement of isolation regions for reducing eddy currents according to one embodiment.
Figure 2Z:
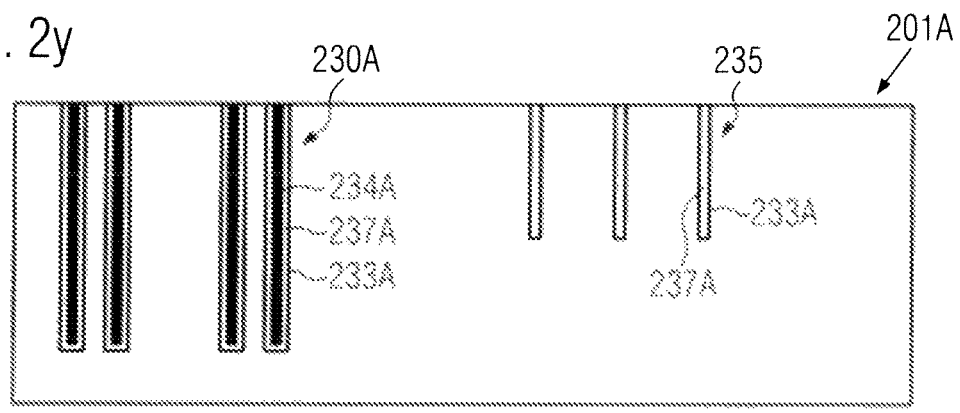

With reference to FIGS. 2x-2z further illustrative embodiments will now be described in which appropriate isolation regions may be incorporated into the semiconductor substrate so as to reduce any eddy currents upon operating the coupling elements. To this end, the isolation regions may be positioned within the substrate material at any appropriate position and with an appropriate shape so as to substantially reduce or disrupt currents which may basically be generated upon operating the coupling elements due to magnetic coupling in substrate materials, which may have a more or less pronounced conductivity. To this end, in some advantageous embodiments, the isolation regions, for instance in the form of trenches and the like, so as to obtain the desired blocking or reduction effect for eddy currents, are formed using the TSV process steps thereby achieving a highly efficient overall process flow. In other illustrative embodiments (not shown) corresponding isolation regions in the substrates may be formed on the basis of a dedicated patterning sequence that is independent of the manufacturing sequence for forming the through hole vias.

FIG. 2x schematically illustrates the perspective view of the substrate 201a, i.e., a portion of the corresponding wafer, which may comprise a plurality of semiconductor chips, as discussed above. It should be appreciated that similar considerations also hold true for the other semiconductor wafer or substrate 201b (not shown). In the present case, the intrinsic conductivity of the substrate material 201a may be moderately high, which may thus contribute to significant losses upon operating the coupling element 220a. In this embodiment, corresponding isolation trenches 235a are provided in a substantially radial configuration. Thus, the radial structure of the isolation regions 235a is continuous, at least to a pronounced degree, in the circular eddy currents induced by the variation of the magnetic field caused by the coupling element 220a. In this manner, the coupling element 220a may be provided with a higher Q-factor, which in turn results in a higher energy transfer efficiency without the usage of non-standard high resistive substrates.

The isolation trenches or regions 235a may be formed together with the through hole vias 230a in a common manufacturing sequence, for instance by appropriately patterning respective trenches in combination with an appropriate configuration of the through hole via, for instance in an annular shape, thereby preserving a central portion thereof, which may be used as a conductive "fill material" due to the high conductivity of the base material. Consequently, an area surrounding the central portion, possibly connecting to the trenches of the isolation regions 235a may subsequently be formed, after a corresponding lithography process and patterning process, an appropriate dielectric material may be formed, for instance by oxidation, deposition techniques, or any combination thereof, as is also discussed above with reference to FIGS. 2c-2f. Thus, in the manufacturing stage shown in FIG. 2x, a dielectric material may be formed or deposited into the trenches followed by the removal of any excess material, as discussed above. It should be appreciated that the isolation regions 235a may have any appropriate geometric configuration, as long as an efficient discontinuation, or at least significant reduction, of any eddy currents in the conductive wafer material 201a is achieved. On the other hand, the structure is selected such that mechanical stability of the substrate 201a is preserved.

FIG. 2y schematically illustrates a top view of a portion of the wafer 201a according to further illustrative embodiments in which the substrate material may have a conductivity that is considered inappropriate for providing sufficient current drive capability for the through hole via 230a, which however may nevertheless result in significant losses due to eddy currents. In this case, the through hole via 230a may be formed in accordance with any of the strategies described above, i.e., a sufficiently dimensioned opening is formed in the substrate material 201a, possibly in an annular configuration, as shown in FIG. 2y. On the other hand, the corresponding trenches of the isolation regions 235w having the desired geometric configuration for suppressing eddy currents may be provided with a reduced width. In this manner, the corresponding fill behavior during the subsequent incorporation of insulating and conductive materials may be significantly different with respect to the opening of the through hole via 230a. Consequently, during a corresponding process sequence, as for instance described above, an insulating material may be formed, for instance by oxidation, as indicated by 233a, followed by the deposition of a further dielectric material, such as silicon dioxide and the like, as indicated by 237a. Due to the reduced width of the trenches of the isolation regions 233a, a substantially complete fill of the trenches is obtained, thereby providing for the desired dielectric behavior of the regions 233a, while the increased width in the through hole via 230a results in increased sidewall coverage of the trenches on the basis of the layers 233a, 237a. Hence, during a subsequent deposition of a conductive fill material, the openings of the through hole via 230a are filled with the material 234a, while incorporation thereof into the isolation regions 233a is suppressed.

FIG. 2z schematically illustrates a cross-sectional view of the substrate 201a in the manufacturing stage shown in FIG. 2y. As illustrated, the through hole via 230a may extend, in this manufacturing stage, to a certain depth in the substrate 201a while, due to the reduced width 235w of the regions 235, the corresponding etch process may have resulted in a significantly reduced depth. Moreover, as shown, the regions 235 are completely filled by the dielectric materials 233a, 237a.

As discussed above, in other illustrative embodiments the process module for forming trenches and filling the trenches with an appropriate material may be repeated, however without incorporating a conductive material in order to separately form the isolation regions 235a.

It should be appreciated that a similar processing may be applied to the substrate 201a.

Consequently, the eddy currents beneath the corresponding coupling element, such as the coupling element 220a as shown in FIG. 2x, may significantly be reduced thereby also resulting in an improved Q-factor, which may be as high as ninety percent at a frequency of 250 MHz for a substrate having a conductivity of $10^4$ S/m.

FIG. 3a schematically illustrates the functionality obtained by the stacked device configuration, as for instance shown in FIG. 2w. In this case, a plurality of data transfer channels are provided between semiconductor chips 300a, 300b having the same configuration as described above, which may be accomplished by providing an appropriate number of coupling elements thereby providing a respective number of micro transformers. For example, the various data transfer channels, indicated by 391, 392, 393, may be configured so as to allow a bi-directional data transfer, for instance by appropriately configuring the coupling elements and the respective circuitry connected thereto. In other cases, the data transfer may be uni-directional thereby significantly simplifying the overall configuration. In addition or alternatively to the one or more data transfer channels 391, . . . , 393, one or more energy transfer channels may be provided so as to allow to establish an appropriate supply voltage for one of the chips 300a, 300b on the basis of the supply voltage of the other one of the chips 300a, 300b. Also in this case, the one or more energy transfer channels 394 may be configured so as to enable bi-directional energy transfer or uni-directional energy transfer. The general behavior of the galvanically-isolated channels 394 and/or 391, . . . , 393 may be adjusted on the basis of the isolation barrier 320c, for instance by appropriately selecting the material composition and/or the thickness thereof. It should be appreciated that, for instance, the material composition of the isolation barrier 320c may be modified in a local varying manner, for instance by selectively providing a different material composition thereby, for instance, enhancing the coupling efficiency and/or the dielectric strength for otherwise a given geometric configuration. To this end, appropriate material treatments may be performed in a locally selective manner, for instance by using appropriate masking regimes, etch and deposition techniques and the like.

FIG. 3b schematically illustrates a basic configuration of an energy/data transfer channel 390, which may be accomplished on the basis of the stacked configuration according to one embodiment. As illustrated, an appropriate circuitry 310a may be provided in the corresponding semiconductor chip 300, which may act as an energy supply circuitry or generally as a transmitter, which is connected to the coupling element 320a, wherein any appropriate control or interface circuit may be implemented in the circuit portion 310a, for instance for receiving input data, input energy and the like. Similarly, a circuit portion 310b is provided in the chip 300b and is connected to the coupling element 320b, possibly in combination with any appropriate interface circuitry, wherein the circuit portion 310b may thus represent a receiver circuit, for instance when a uni-directional data transfer channel is considered. Based on an interface/control circuit portion in the circuit 310b, corresponding output data may be provided in a galvanically-isolated manner with respect to input data provided to the semiconductor chip 300a. As discussed above, circuit portions 310a, 310b may be provided in a very space-efficient manner, for instance with respect to the lateral size thereof, due to the stacked chip configuration, as discussed above. Moreover, the coupling behavior and the isolation strength of the coupling elements 320a, 320b may be adjusted by selecting appropriate material characteristics and a thickness in the isolation barrier 320c without a corresponding modification in the respective manufacturing processes for forming the semiconductor chips 300a, 300b. It should be appreciated that the energy/data transfer channel 390 may appropriately be configured so as to enable a bi-directional energy and/or data transfer, for instance by appropriately configuring the circuit portions 310a, 310b or by providing two uni-directional channels in opposite transfer directions. In this case a corresponding number of micro transformers are provided in the device 300.

As a consequence, the stacked configuration according to one embodiment allows the incorporation of coupling elements which may be formed independently from each other by any appropriate process technology, wherein the final characteristics with respect to coupling efficiency and/or dielectric strength may be adjusted upon bonding the individual semiconductor chips. Bonding of the semiconductor chips may be accomplished on wafer level thereby contributing to a very efficient overall process flow. Moreover, any appropriate process technology may be applied for fabricating the individual semiconductor chips, for instance using CMOS, bipolar, DMOS techniques or any combination thereof, wherein the corresponding coupling elements may readily be implemented without any additional process steps. On the other hand, an efficient electrical connection to the periphery, i.e., the package substrate, may be accomplished by providing corresponding back side metallization system, which may connect to the front side metallization systems on the basis of through-hole vias, which may be formed at any appropriate manufacturing stage.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor device comprising:
   a first chip including:
      a first substrate;
      a first semiconductor layer on the first substrate;
      a first circuit portion formed in and above said first semiconductor layer; and
      a first through hole via extending through said first substrate and connecting a rear side of said first substrate with said first circuit portion;
   a second chip attached to said first chip to form a stacked configuration, the second chip including:
      a second substrate;
      a second semiconductor layer on the second substrate;
      a second circuit portion formed in and above said second semiconductor layer; and
      a second though hole via extending through said second substrate and connecting a rear side of said second substrate with said second circuit portion, said first and second circuit portions being positioned to implement an electromagnetic near field coupling mechanism to each others; and
   a first plurality of isolation regions formed in said first substrate and a second plurality of isolation regions formed in said second substrate, wherein said first and second pluralities of isolation regions are configured and arranged to reduce eddy currents in said first and second substrates, the isolation regions of said first plurality extend radially outwardly from the first through hole via, and the isolation regions of said second plurality extend radially outwardly from the second through hole via.

2. The semiconductor device of claim 1 wherein the first circuit portion includes a first coupling element formed in or above said first substrate and the second circuit portion includes a second coupling element formed in or above said second substrate, wherein said first and second coupling elements are positioned to provide said electromagnetic near field coupling mechanism.

3. The semiconductor device of claim 1, wherein said first and second chips are attached to each other such that said first and second semiconductor layer face each other.

4. The semiconductor device of claim 1, wherein at least one of said first and second through hole vias comprises a high temperature resisting conductive fill material.

5. The semiconductor device of claim 1, wherein at least one of said first and second through hole vias comprises as a conductive fill material at least one of a metal, a polymer and a substance comprising functional molecules.

6. The semiconductor device of claim 1, wherein said first and second circuit portions are configured to enable wireless signal transfer between said first and second circuit portions.

7. The semiconductor device of claim 6, wherein said wireless signal transfer capability comprises a plurality of independent signal transfer channels.

8. The semiconductor device of claim 6, wherein said first and second circuit portions are configured to enable a full duplex signal transfer.

9. The semiconductor device of claim 1, wherein said first and second circuit portions are configured to enable an energy transfer.

10. The semiconductor device of claim 1 further comprising a package that accommodates said first and second chips.

11. A device comprising:
   a first integrated circuit chip including:
      a first semiconductor substrate;
      a first active circuit formed in the first semiconductor substrate;

a first metallization layer on the first semiconductor substrate;
a first contact pad on a surface of the first integrated circuit chip;
a first metalized through via in the first semiconductor layer and connecting the first metallization layer to the first contact pad;
a plurality of first isolation trenches formed in the first semiconductor layer and extending radially away from the first metalized through via; and
a first electromagnetic coupling element formed in the first metallization layer and coupled to the first active circuit;
a second integrated circuit chip stacked on the first integrated circuit chip, the second integrated circuit chip including:
a second semiconductor substrate;
a second active circuit formed in the second semiconductor substrate;
a second metallization layer on the second semiconductor substrate; and
a second electromagnetic coupling element formed in the second metallization layer and electrically connected to the second active circuit, the first electromagnetic coupling element being configured to transmit a wireless signal to the second electromagnetic coupling element.

12. The device of claim 11 wherein the first and second electromagnetic coupling elements respectively comprise first and second voltage transformers.

13. The device of claim 11 wherein the first and second active circuits are configured to implement a full duplex data transfer channel with the first and second electromagnetic coupling elements.

14. The device of claim 11 wherein the first and second active circuits are configured to implement multiple data transfer channels with the first and second electromagnetic coupling elements.

15. The device of claim 11 comprising:
a plurality of second isolation trenches formed in the second semiconductor layer adjacent the second metallization layer and filled with insulating material.

16. The device of claim 11 comprising a molding compound encapsulating the first and second integrated circuit chips.

17. The device of claim 15 comprising a second metalized through via in the first semiconductor layer connecting the second metallization layer to a second contact pad on a surface of the second integrated circuit chip, wherein the second isolation trenches extend radially away from the second metalized through via.

* * * * *

UNITED STATES PATENT AND TRADEMARK OFFICE
CERTIFICATE OF CORRECTION

PATENT NO. : 9,018,730 B2
APPLICATION NO. : 13/438684
DATED : April 28, 2015
INVENTOR(S) : Crocifisso Marco Antonio Renna et al.

It is certified that error appears in the above-identified patent and that said Letters Patent is hereby corrected as shown below:

Title page

Item (30):
Should read as follows:
--ITALY VI2011A000080 04/05/2011--.

In the Claims

Column 22, Line 22:
Claim 1 "mechanism to each others; and" should read as --mechanism to each other; and--.

Signed and Sealed this
Twentieth Day of October, 2015

Michelle K. Lee
*Director of the United States Patent and Trademark Office*